(12) United States Patent
Shi et al.

(10) Patent No.: US 10,732,898 B2
(45) Date of Patent: Aug. 4, 2020

(54) METHOD AND APPARATUS FOR ACCESSING FLASH MEMORY DEVICE

(71) Applicant: HUAWEI TECHNOLOGIES CO., LTD., Shenzhen, Guangdong (CN)

(72) Inventors: Liang Shi, Chongqing (CN); Chun Xue, Chongqing (CN); Qiao Li, Chongqing (CN); Dongfang Shan, Shenzhen (CN); Jun Xu, Nanjing (CN); Yuangang Wang, Shenzhen (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 71 days.

(21) Appl. No.: 16/105,723

(22) Filed: Aug. 20, 2018

(65) Prior Publication Data
US 2018/0357013 A1 Dec. 13, 2018

Related U.S. Application Data

(63) Continuation of application No. PCT/CN2016/074140, filed on Feb. 19, 2016.

(51) Int. Cl.
G06F 3/06 (2006.01)
G11C 11/56 (2006.01)
(Continued)

(52) U.S. Cl.
CPC .......... *G06F 3/0659* (2013.01); *G06F 3/0604* (2013.01); *G06F 3/0679* (2013.01);
(Continued)

(58) Field of Classification Search
None
See application file for complete search history.

(56) References Cited

U.S. PATENT DOCUMENTS 5,848,621 A 12/1998 Cheung
6,091,640 A 7/2000 Kawahara et al.
(Continued)

FOREIGN PATENT DOCUMENTS

CN 102073592 A 5/2011
CN 102667739 A 9/2012
(Continued)

OTHER PUBLICATIONS

Qiao Li et al, Maximizing 10 Performance Via Conflict Reduction for Flash Memory Storage Systems. 2015 Design, Automation and Test in Europe Conference and Exhibition (DATE), pp. 904-907.
(Continued)

Primary Examiner — Tracy C. Chan

(57) ABSTRACT

A method for accessing a flash memory device and a flash memory device. After receiving a write request for an address, a flash memory controller obtains an indicator of the address, where the indicator indicates a last access type of the address, which might be a write operation or a read operation. When determining the indicator indicates a write operation, which means the access type for the address is normally write operation, to save time, the flash memory controller perform a fast-write operation on the address, when the indicator indicates a read operation, which means there might be plenty of read operations on the address, to facilitate future read operation, the controller performs a slow-write operation on the address.

18 Claims, 10 Drawing Sheets

(51) Int. Cl.
   *G06F 12/02* (2006.01)
   *G11C 16/28* (2006.01)
   *G11C 16/26* (2006.01)
(52) U.S. Cl.
   CPC ...... *G06F 12/0246* (2013.01); *G11C 11/5642* (2013.01); *G11C 16/26* (2013.01); *G11C 16/28* (2013.01); *G06F 2212/1024* (2013.01); *G06F 2212/1032* (2013.01); *G06F 2212/7201* (2013.01); *G06F 2212/7202* (2013.01)

(56) References Cited

U.S. PATENT DOCUMENTS

| | | |
|---|---|---|
| 2008/0005508 A1 | 1/2008 | Asano et al. |
| 2009/0049364 A1 | 2/2009 | Jo et al. |
| 2010/0017561 A1 | 1/2010 | Yang et al. |
| 2012/0011308 A1 | 1/2012 | Asano et al. |
| 2012/0117334 A1* | 5/2012 | Sheaffer ............... G06F 12/084 711/145 |
| 2012/0246397 A1* | 9/2012 | Nakai ................ G06F 12/0638 711/103 |
| 2013/0145082 A1* | 6/2013 | Tamagawa .......... G06F 12/0246 711/103 |
| 2013/0283125 A1 | 10/2013 | Gladwin et al. |
| 2013/0318418 A1* | 11/2013 | Bedeschi ............ G06F 11/1048 714/758 |
| 2014/0122972 A1 | 5/2014 | Nakanishi et al. |
| 2014/0219020 A1 | 8/2014 | Kwak et al. |
| 2014/0369124 A1 | 12/2014 | Moon et al. |
| 2014/0372674 A1 | 12/2014 | Kim et al. |
| 2015/0347040 A1* | 12/2015 | Mathur ................ G06F 3/0616 711/103 |
| 2015/0347041 A1* | 12/2015 | Kotte .................... G06F 3/0616 711/103 |
| 2017/0052859 A1* | 2/2017 | Scouller ............. G06F 12/0246 |

FOREIGN PATENT DOCUMENTS

| | | |
|---|---|---|
| CN | 104503710 A | 4/2015 |
| JP | H106276 A | 1/1998 |
| JP | 2008015623 A | 1/2008 |
| JP | 2009048758 A | 3/2009 |
| JP | 2014086062 A | 5/2014 |
| JP | 2014154202 A | 8/2014 |
| KR | 20120008483 A | 1/2012 |

OTHER PUBLICATIONS

Ren-Shuo Liu et al, Optimizing NAND Flash-Based SSDs via Retention Relaxation. Proceedings of the 10th USENIX conference on File and Storage Technologies, Feb. 2012, 14 pages.

Yangyang Pan et al, Quasi-Nonvolatile SSD: Trading Flash Memory Nonvolatility to Improve Storage System Performance for Enterprise Applications. 2011 IEEE, 10 pages.

Shi Liang et al: "Error Model Guided Joint Performance and Endurance Optimization for Flash Memory", IEEE Transactions on Computer Aided Design of Integrated Circuits and Systems, vol. 33, No. 3, Mar. 1, 2014, pp. 343-355, XP011539961.

* cited by examiner

METHOD AND APPARATUS FOR ACCESSING FLASH MEMORY DEVICE

CROSS-REFERENCE TO RELATED APPLICATIONS

This application is a continuation of International Application No. PCT/CN2016/074140, filed on Feb. 19, 2016, the disclosure of which is hereby incorporated by reference in its entirety.

TECHNICAL FIELD

Embodiments of the present invention relate to the computer field, and in particular, to a method and an apparatus for accessing a flash memory device.

BACKGROUND

Solid state drives (SSDs) based on a flash memory has gradually replaced conventional magnetic disks, and become an important storage medium for advantages such as excellent random access performance, low density, and low power consumption. In recent years, flash memory technologies develop rapidly, and a storage density has developed from a single level cell to a recent multiple level cell, for example, six bits, and a manufacturing technique develops from 65 nanometers to 10 nanometers. With these developments, a storage density of a flash memory increases rapidly, while reliability of a flash memory decreases greatly. An error-correcting code with a stronger error correction capability is needed to correctly encode and decode data.

To resolve the problem of reliability of a flash memory, a low density parity check code (LDPC) error correction mechanism is used in a solution that is currently widely used. LDPC decoding is implemented by using a belief propagation algorithm, and is classified into hard decision decoding and soft decision decoding. The hard decision decoding has high efficiency and needs a short time for reading and decoding, but can decode only data having a low error rate. The soft decision decoding can correctly decode data having a relatively high error rate, but has a relatively long latency in reading and decoding. When an LDPC code is used as a check code, there is a correlation between a read request time and an error rate, and a time needed by a read request for data having a high error rate is relatively long.

Data is written to a flash memory in an incremental step pulse programming (ISPP) manner. To enable a flash cell to reach a predetermined voltage, a manner of gradually increasing a programming voltage is used. A programming step voltage used to write data determines an error rate of data to a great extent. When the programming step voltage is higher, a predetermined voltage value can be reached after a relatively small quantity of iterations. However, when the programming step voltage is higher, programming accuracy is lower, and an error rate is higher. Therefore, when a programming speed is higher, an error rate is higher; and when a programming speed is lower, an error rate is lower.

For storage in a flash memory, a certain amount of electric charge is stored in a flash cell of the flash memory to represent data. As a storage time increases, the electric charge in the flash cell flows out. When a storage time is longer, a larger amount of electricity is leaked, and an error rate is higher. In the prior art, according to a time of storing data in a flash memory, a write operation on the data may be regulated. If data needs to be stored for a long time, a write operation is performed in a form of a slow write. When data is written at a low speed, an error rate is low, it is more likely that the data can be read correctly. If data needs to be stored for a short time, an error rate caused by leakage of electricity is relatively low, and a write operation may be performed in a form of a fast write. In the prior art, when a read operation is performed, hard decision decoding is first used, and if the hard decision decoding fails, soft decision decoding is used.

In the prior art, read and write operations on a flash memory cannot be flexibly and effectively adjusted, and a new technology needs to be developed to resolve the problem.

SUMMARY

In view of this, the present invention discloses a method and an apparatus for accessing a flash memory device. Read and write operations on a flash memory device are regulated according to an access characteristic of data, and overall access performance of the flash memory device is improved.

According to a first aspect, the present invention provides a method for accessing a flash memory device. An access type of access to a flash memory device includes a write operation and a read operation. The method includes: receiving, by a storage controller, an access request, where the access request indicates a to-be-accessed storage area, for example, the access request carries address information of the to-be-accessed storage area; obtaining, by the storage controller, historical access information of the to-be-accessed storage area, where the historical access information includes a historical access type of the to-be-accessed storage area; and performing, by the storage controller, an access operation on the to-be-accessed storage area according to the historical access information and an access type of the current access request.

A relationship may be established between a read speed and a write speed of data in a flash memory according to an error rate. In a flash memory storage system, if a programming speed is high when data is written, an error rate is high, and a read speed of the data is low; on the contrary, if a programming speed is low when data is written, an error rate is low, and a read speed of the data is high. Regulation may be performed on the flash memory device according to an internal relationship between the read operation and the write operation.

With reference to the first aspect, in a first possible implementation of the first aspect, if the historical access type is a write operation, and the access type of the current access request is a write operation, the performing, by the storage controller, an access operation on the to-be-accessed storage area includes: performing, by the storage controller, a write operation on the to-be-accessed storage area in a form of a fast write, where a form of the write operation includes the fast write and a slow write, and a write speed of the fast write is greater than a write speed of the slow write.

If the historical access type and the access type of the current access request are both write operations, it indicates that data stored in the to-be-accessed storage area has a "write-only" characteristic, and frequency of a write operation on the to-be-accessed storage area is much greater than frequency of a read operation on the to-be-accessed storage area. Therefore, a write operation may be performed on the to-be-accessed storage area in the form of the fast write, thereby improving an overall access speed of the flash memory device.

With reference to the first aspect, in a second possible implementation of the first aspect, if the historical access type is a read operation, and the access type of the current access request is a read operation, the performing, by the storage controller, an access operation on the to-be-accessed storage area includes: performing, by the storage controller, a read operation on the to-be-accessed storage area in a form of a fast read, and if decoding using the fast read fails, reading the to-be-accessed storage area again in a form of a slow read, and rewriting data stored in the to-be-accessed storage area to the to-be-accessed storage area in a form of the slow write, where a form of the read operation of the storage controller includes the fast read and the slow read, and a read speed of the fast read is greater than a read speed of the slow read.

If the historical access type and the access type of the current access request are both read operations, it indicates that the data stored in the to-be-accessed storage area has a "read-only" characteristic, and frequency of a read operation on the to-be-accessed storage area is much greater than frequency of a write operation. Therefore, if decoding in the form of the fast read on the to-be-accessed storage area fails, it indicates that accuracy of the data stored in the to-be-accessed storage area is not high enough, and the data stored in the to-be-accessed storage area is rewritten to the to-be-accessed storage area in the form of the slow write, thereby ensuring the accuracy of the data to accelerate a subsequent read operation on the to-be-accessed storage area, and improving an overall access speed of the flash memory device.

Optionally, in another possible implementation, if the data in the to-be-accessed storage area has a read-only characteristic, when a bit error rate of decoding during a read operation exceeds a preset threshold, the data stored in the to-be-accessed storage area is rewritten to the to-be-accessed storage area in the form of the slow write.

With reference to the first aspect, in a third possible implementation of the first aspect, the historical access information further includes a write speed mark. The write speed mark is used to indicate a form of a write operation on data in the to-be-accessed storage area. If the historical access type and the access type of the current access request are both read operations, and the write speed mark does not indicate the slow write, the method further includes: rewriting, by the storage controller, the data stored in the to-be-accessed storage area to the to-be-accessed storage area in a form of the slow write.

The write speed mark is mainly used to indicate whether the data stored in the to-be-accessed storage area is written in the form of the slow write. If the data stored in the to-be-accessed storage area is not written in the form of the slow write, it indicates to a great extent that accuracy of the data stored in the to-be-accessed storage area is not high enough. If the data has a "read-only" characteristic, the data stored in the to-be-accessed storage area is rewritten to the to-be-accessed storage area in the form of the slow write, thereby ensuring the accuracy of the data to accelerate a subsequent read operation on the to-be-accessed storage area, and improving an overall access speed of the flash memory device.

With reference to any one of the first aspect or the foregoing possible implementations of the first aspect, in a fourth possible implementation of the first aspect, before the rewriting, by the storage controller, the data stored in the to-be-accessed storage area in a form of the slow write, the method further includes: saving, by the storage controller, address information in a rewrite queue; and reading, by the storage controller from the to-be-accessed storage area according to the address information saved in the rewrite queue, the data stored in the to-be-accessed storage area.

The address information of the to-be-accessed storage area in which a rewrite needs to be performed is written to a rewrite queue, and a rewrite operation is performed when the flash memory device is idle or has relatively light load, thereby avoiding that the rewrite operation blocks normal read access and normal write access.

Optionally, the data that is read may also be directly rewritten to the to-be-accessed storage area after the current read operation ends, thereby avoiding consumption caused by a subsequent reread.

With reference to any one of the first aspect or the foregoing possible implementations of the first aspect, in a fifth possible implementation of the first aspect, the form of the write operation further includes a normal write, and a write speed of the normal write is greater than the write speed of the slow write and is less than the write speed of the fast write. If the historical access type is not a write operation, and the access type of the current access request is a write operation, the performing, by the storage controller, an access operation on the to-be-accessed storage area includes: performing, by the storage controller, a write operation on the to-be-accessed storage area in a form of the normal write.

If the historical access type is not a write operation, and the access type of the current access request is a write operation, it indicates that the data stored in the to-be-accessed storage area has a "cross-access" characteristic, and it indicates that the frequency of a read operation and the frequency of a write operation on the to-be-accessed storage area are substantially equal. In this case, a write operation may be performed on the to-be-accessed storage area in the form of the normal write, thereby balancing speeds of a read operation and a write operation, and improving an overall access speed of the flash memory device.

With reference to any one of the first aspect or the foregoing possible implementations of the first aspect, in a sixth possible implementation of the first aspect, the historical access information further includes the write speed mark. If the access type of the current access request is a read operation, the performing, by the storage controller, an access operation on the to-be-accessed storage area according to the historical access information and an access type of the access request includes: performing, by the storage controller, a read operation on the to-be-accessed storage area according to the write speed mark, where the fast write corresponds to the slow read, and the slow write corresponds to the fast read.

A corresponding form of a read operation is used according to a form of a write operation on the data in the to-be-accessed storage area. This can reduce a time of the read operation to some extent, and improve an overall access speed of the flash memory device.

With reference to any one of the first aspect or the foregoing possible implementations of the first aspect, in a seventh possible implementation of the first aspect, if the historical access type and the access type of the current access request are different, the method further includes: updating, by the storage controller, the historical access type according to the access type of the current access request.

Further, if the historical access information includes the write speed mark, and the access type of the current access request is a write operation, if the form of the current write operation and the form indicated by the write speed mark in the historical access information are different, the write speed mark further needs to be updated.

With reference to any one of the first aspect or the foregoing possible implementations of the first aspect, in an eighth possible implementation of the first aspect, the obtaining, by the storage controller, historical access information of the to-be-accessed storage area includes: searching, by the storage controller, for the historical access information that is of the to-be-accessed storage area and that is recorded in a historical access record. For example, a historical access information entry corresponding to the to-be-accessed storage area may be searched for according to the address information of the to-be-accessed storage area, where the historical access information entry includes the historical access information of the to-be-accessed storage area.

With reference to any one of the first aspect or the foregoing possible implementations of the first aspect, in a ninth possible implementation of the first aspect, before the receiving, by a storage controller, an access request, the method further includes: receiving, by the storage controller, a second write access request, where the second write access request is a first-time write access request for the to-be-accessed storage area; and writing, by the storage controller, to-be-written data of the second write access request to the to-be-accessed storage area, and recording the historical access information of the to-be-accessed storage area in the historical access record. Specifically, the second write access request carries the address information of the to-be-accessed storage area, and the storage controller creates, in the historical access record according to the address information, the historical access information entry corresponding to the address information.

The second write access request is a first-time write for the to-be-accessed storage area from a "data invalid" state to a "data valid" state. During the first-time write, the historical access information of the to-be-accessed storage area is recorded. For example, the historical access information entry corresponding to the to-be-accessed storage area is created, and the historical access type of the to-be-accessed storage area is recorded as a write operation.

With reference to any one of the first aspect or the foregoing possible implementations of the first aspect, in a tenth possible implementation of the first aspect, the writing, by the storage controller, to-be-written data of the second write access request to the to-be-accessed storage area includes: writing, by the storage controller, the to-be-written data of the second write access request to the to-be-accessed storage area in the form of the slow write.

The second write access request is a first-time write for the to-be-accessed storage area from a "data invalid" state to a "data valid" state. Because it cannot be determined whether an access type of the written data has a "read-only" characteristic, the first-time write is a write in the form of the slow write. Certainly, another form of write operation may also be used.

With reference to any one of the first aspect or the foregoing possible implementations of the first aspect, in an eleventh possible implementation of the first aspect, the method further includes: when the storage controller determines that the data in the to-be-accessed storage area is invalid, deleting the recorded historical access information of the to-be-accessed storage area. For example, the storage controller receives a deletion notification message, where the deletion notification message carries the address information; and the storage controller deletes the historical access information of the to-be-accessed storage area according to the deletion notification message.

Specifically, the deletion notification message may be a trim instruction used to instruct a user to delete the data in the to-be-accessed storage area, so that the storage controller sets the address information of the to-be-accessed storage area to be invalid, so as to facilitate subsequent garbage collection.

According to a second aspect, the present invention provides a method for accessing a flash memory device. A type of access to a flash memory device includes a write operation and a read operation, a form of the write operation on the flash memory device includes a fast write and a slow write, and a write speed of the fast write is greater than a write speed of the slow write. The method includes: receiving a first write access request for a to-be-accessed storage area, where the first write access request carries address information of the to-be-accessed storage area; obtaining a historical access type of the to-be-accessed storage area according to the address information, where the historical access type is an access type of access to the to-be-accessed storage area before the first write access request; and when the historical access type of the to-be-accessed storage area is a write operation, writing to-be-written data of the first write access request to the to-be-accessed storage area in a form of the fast write.

If the historical access type of the to-be-accessed storage area and an access type of the current access request are both write operations, it indicates that data stored in the to-be-accessed storage area has a "write-only" characteristic, and frequency of a write operation on the to-be-accessed storage area is much greater than frequency of a read operation. Therefore, a write operation is performed on the to-be-accessed storage area in the form of the fast write, thereby improving an overall access speed of the flash memory device.

With reference to the second aspect, in a first possible implementation of the second aspect, the obtaining a historical access type of the to-be-accessed storage area includes: searching for the historical access type that is of the to-be-accessed storage area and that is recorded in a historical access record.

Specifically, a historical access information table may be maintained. The historical access information table records a historical access information entry corresponding to each piece of address information with valid data, and the historical access information entry records the historical access type of the to-be-accessed storage area.

With reference to any one of the second aspect or the foregoing possible implementation of the second aspect, in a second possible implementation of the second aspect, before the receiving a first write access request for a to-be-accessed storage area, the method further includes: receiving a second write access request for the to-be-accessed storage area, where the second write access request is a first-time write access request for the to-be-accessed storage area; and writing to-be-written data of the second write access request to the to-be-accessed storage area, and recording the historical access type of the to-be-accessed storage area in the historical access record.

The second write access request is a first-time write for the to-be-accessed storage area from a "data invalid" state to a "data valid" state. During the first-time write, the historical access information entry corresponding to the to-be-accessed storage area is created, and the historical access type of the to-be-accessed storage area is recorded as a write operation.

With reference to any one of the second aspect or the foregoing possible implementations of the second aspect, in a third possible implementation of the second aspect, the writing to-be-written data of the second write access request to the to-be-accessed storage area includes: writing the to-be-written data of the second write access request to the to-be-accessed storage area in a form of the slow write.

The second write access request is a first-time write for the to-be-accessed storage area from a "data invalid" state to a "data valid" state. Because it cannot be determined whether an access type of the written data has a "read-only" characteristic, the first-time write is a write in the form of the slow write. Certainly, another form of write operation may also be used during the first-time write.

With reference to any one of the second aspect or the foregoing possible implementations of the second aspect, in a fourth possible implementation of the second aspect, the method further includes: when it is determined that the data in the to-be-accessed storage area is invalid, deleting the recorded historical access type of the to-be-accessed storage area.

Specifically, the historical access information entry corresponding to the to-be-accessed storage area may be deleted when a trim instruction of an operating system is received. The trim instruction indicates that the data in the current to-be-accessed storage area has been deleted by the operating system.

With reference to any one of the second aspect or the foregoing possible implementations of the second aspect, in a fifth possible implementation of the second aspect, the method further includes: when the historical access type of the to-be-accessed storage area is not a write operation, writing the to-be-written data of the first write access request to the to-be-accessed storage area in the form of the slow write, and updating the historical access type of the to-be-accessed storage area.

Specifically, if the historical access information entry records more than one historical access type, provided that one of the historical access types is not a write operation, it is considered that the historical access type is not a write operation, and it is considered that the historical access type is a write operation only when all the recorded historical access types are write operations.

With reference to any one of the second aspect or the foregoing possible implementations of the second aspect, in a sixth possible implementation of the second aspect, the form of the write operation further includes a normal write, and a write speed of the normal write is greater than the write speed of the slow write and is less than the write speed of the fast write; and the method further includes: when the historical access type of the to-be-accessed storage area is not a write operation, writing the to-be-written data of the first write access request to the to-be-accessed storage area in a form of the normal write, and updating the historical access type of the to-be-accessed storage area.

If the historical access type is not a write operation, and the access type of the current access request is a write operation, it indicates that the data stored in the to-be-accessed storage area has a "cross-access" characteristic, and it indicates that the frequency of a read operation and the frequency of a write operation on the to-be-accessed storage area are substantially equal. In this case, a write operation may be performed on the to-be-accessed storage area in the form of the normal write, thereby balancing speeds of a read operation and a write operation, and improving an overall access speed of the flash memory device.

According to a third aspect, the present invention provides a method for accessing a flash memory device. A type of access to a flash memory device includes a write operation and a read operation. A form of the write operation on the flash memory device includes a fast write and a slow write, and a write speed of the fast write is greater than a write speed of the slow write. A form of the read operation on the flash memory device includes a fast read and a slow read, and a read speed of the fast read is greater than a read speed of the slow read. The method includes: receiving a read access request for a to-be-accessed storage area; performing a read operation on the to-be-accessed storage area in a form of the fast read; obtaining a historical access type of the to-be-accessed storage area, where the historical access type is an access type of access to the to-be-accessed storage area before the read access request; and when decoding using the fast read fails and the historical access type is a read operation, rewriting data stored in the to-be-accessed storage area to the to-be-accessed storage area in a form of the slow write.

If the historical access type and an access type of the current access request are both read operations, it indicates that the data stored in the to-be-accessed storage area has a "read-only" characteristic, and frequency of a read operation on the to-be-accessed storage area is much greater than frequency of a write operation. Therefore, if decoding in the form of the fast read on the to-be-accessed storage area fails, it indicates that accuracy of the data stored in the to-be-accessed storage area is not high enough, and the data stored in the to-be-accessed storage area is rewritten to the to-be-accessed storage area in the form of the slow write, thereby ensuring the accuracy of the data to accelerate a subsequent read operation on the to-be-accessed storage area, and improving an overall access speed of the flash memory device.

Optionally, in another possible implementation, if the data in the to-be-accessed storage area has a read-only characteristic, when a bit error rate of decoding during the read operation exceeds a preset threshold, the data stored in the to-be-accessed storage area is rewritten to the to-be-accessed storage area in the form of the slow write.

With reference to the third aspect, in a first possible implementation of the third aspect, the obtaining a historical access type of the to-be-accessed storage area includes: searching for the historical access type that is of the to-be-accessed storage area and that is recorded in a historical access record.

Specifically, a historical access information table may be maintained. The historical access information table records a historical access information entry corresponding to each piece of address information with valid data, and the historical access information entry records the historical access type of the to-be-accessed storage area.

With reference to any one of the third aspect or the foregoing possible implementation of the third aspect, in a second possible implementation of the third aspect, before the receiving a read access request for a to-be-accessed storage area, the method further includes: receiving a second write access request for the to-be-accessed storage area, where the second write access request is a first-time write access request for the to-be-accessed storage area; and writing to-be-written data of the second write access request to the to-be-accessed storage area, and recording the historical access type of the to-be-accessed storage area in the historical access record.

The second write access request is a first-time write for the to-be-accessed storage area from a "data invalid" state to a "data valid" state. During the first-time write, the historical access information entry corresponding to the to-be-accessed storage area is created, and the historical access type of the to-be-accessed storage area is recorded as a write operation.

With reference to any one of the third aspect or the foregoing possible implementations of the third aspect, in a third possible implementation of the third aspect, the writing to-be-written data of the second write access request to the to-be-accessed storage area includes: writing the to-be-written data of the second write access request to the to-be-accessed storage area in the form of the slow write.

The second write access request is a first-time write for the to-be-accessed storage area from a "data invalid" state to a "data valid" state. Because it cannot be determined whether an access type of the written data has a "read-only" characteristic, the first-time write is a write in the form of the slow write. Certainly, another form of write operation may also be used during the first-time write.

With reference to any one of the third aspect or the foregoing possible implementations of the third aspect, in a fourth possible implementation of the third aspect, the method further includes: when it is determined that the data in the to-be-accessed storage area is invalid, deleting the recorded historical access type of the to-be-accessed storage area.

Specifically, the historical access information entry corresponding to the to-be-accessed storage area may be deleted when a trim instruction of an operating system is received. The trim instruction indicates that the data in the current to-be-accessed storage area has been deleted by the operating system.

With reference to any one of the third aspect or the foregoing possible implementations of the third aspect, in a fifth possible implementation of the third aspect, the method further includes: when decoding using the fast read fails, performing a read operation on the to-be-accessed storage area in a form of the slow read.

With reference to any one of the third aspect or the foregoing possible implementations of the third aspect, in a sixth possible implementation of the third aspect, the form of the read operation further includes a normal read, and a read speed of the normal read is greater than the read speed of the slow read and is less than the read speed of the fast read; and the method further includes: when decoding using the fast read fails, performing a read operation on the to-be-accessed storage area in a form of the normal read.

Specifically, when decoding using the fast read fails, a quantity of threshold voltages between different states is increased, so as to perform a more precise read the to-be-accessed storage area, thereby improving a success rate of decoding.

With reference to any one of the third aspect or the foregoing possible implementations of the third aspect, in a seventh possible implementation of the third aspect, the method further includes: when the historical access type is not a read operation, updating the historical access type.

Specifically, if the historical access information entry records more than one historical access type, provided that one of the historical access types is not a read operation, it is considered that the historical access type is not a read operation, and it is considered that the historical access type is a read operation only when all the recorded historical access types are read operations.

With reference to any one of the third aspect or the foregoing possible implementations of the third aspect, in an eighth possible implementation of the third aspect, before the rewriting data stored in the to-be-accessed storage area to the to-be-accessed storage area in a form of the slow write, the method further includes: saving address information of the to-be-accessed storage area in a rewrite queue; and reading, from the to-be-accessed storage area according to the address information saved in the rewrite queue, the data stored in the to-be-accessed storage area.

The address information of the to-be-accessed storage area in which a rewrite needs to be performed is written to a rewrite queue, and a rewrite operation is performed when the flash memory device is idle or has relatively light load, thereby avoiding that the rewrite operation blocks normal read access and normal write access.

Optionally, the data that is read may also be directly rewritten to the to-be-accessed storage area after the current read operation ends, thereby avoiding consumption caused by a subsequent reread.

According to a fourth aspect, the present invention provides a method for accessing a flash memory device. A type of access to a flash memory device includes a write operation and a read operation. A form of the write operation on the flash memory device includes a fast write and a slow write, and a write speed of the fast write is greater than a write speed of the slow write. The method includes: receiving a read access request for a to-be-accessed storage area; obtaining historical access information of the to-be-accessed storage area, where the historical access information includes a historical access type and a write speed mark of the to-be-accessed storage area, the write speed mark is used to indicate a form of a write operation on data stored in the to-be-accessed storage area, and the historical access type is an access type of access to the to-be-accessed storage area before the read access request; and when the historical access type is a read operation and the write speed mark does not indicate the slow write, rewriting the data stored in the to-be-accessed storage area to the to-be-accessed storage area in a form of the slow write.

The write speed mark is mainly used to indicate whether the data stored in the to-be-accessed storage area is written in the form of the slow write. If the data stored in the to-be-accessed storage area is not written in the form of the slow write, it indicates to a great extent that accuracy of the data stored in the to-be-accessed storage area is not high enough. If the data has a "read-only" characteristic, the data stored in the to-be-accessed storage area is rewritten to the to-be-accessed storage area in the form of the slow write, thereby ensuring the accuracy of the data to accelerate a subsequent read operation on the to-be-accessed storage area, and improving an overall access speed of the flash memory device.

With reference to the fourth aspect, in a first possible implementation of the fourth aspect, the obtaining historical access information of the to-be-accessed storage area includes: searching for the historical access information that is of the to-be-accessed storage area and that is recorded in a historical access record.

Specifically, a historical access information table may be maintained. The historical access information table records a historical access information entry corresponding to each piece of address information with valid data, and the historical access information entry records the historical access information of the to-be-accessed storage area.

With reference to any one of the fourth aspect or the foregoing possible implementation of the fourth aspect, in a second possible implementation of the fourth aspect, before the receiving a read access request for a to-be-accessed storage area, the method further includes: receiving a second write access request for the to-be-accessed storage area, where the second write access request is a first-time write access request for the to-be-accessed storage area; and writing to-be-written data of the second write access request to the to-be-accessed storage area, and recording the historical access information of the to-be-accessed storage area in the historical access record.

The second write access request is a first-time write for the to-be-accessed storage area from a "data invalid" state to a "data valid" state. During the first-time write, the historical access information entry corresponding to the to-be-accessed storage area is created, and the historical access type of the to-be-accessed storage area is recorded as a write operation.

With reference to any one of the fourth aspect or the foregoing possible implementations of the fourth aspect, in a third possible implementation of the fourth aspect, the writing to-be-written data of the second write access request to the to-be-accessed storage area includes: writing the to-be-written data of the second write access request to the to-be-accessed storage area in the form of the slow write.

The second write access request is a first-time write for the to-be-accessed storage area from a "data invalid" state to a "data valid" state. Because it cannot be determined whether an access type of the written data has a "read-only" characteristic, the first-time write is a write in the form of the slow write. Certainly, another form of write operation may also be used during the first-time write.

With reference to any one of the fourth aspect or the foregoing possible implementations of the fourth aspect, in a fourth possible implementation of the fourth aspect, the method further includes: when it is determined that the data in the to-be-accessed storage area is invalid, deleting the recorded historical access information of the to-be-accessed storage area.

Specifically, the historical access information entry corresponding to the to-be-accessed storage area may be deleted when a trim instruction of an operating system is received. The trim instruction indicates that the data in the current to-be-accessed storage area has been deleted by the operating system.

With reference to any one of the fourth aspect or the foregoing possible implementations of the fourth aspect, in a fifth possible implementation of the fourth aspect, after the rewriting the data stored in the to-be-accessed storage area to the to-be-accessed storage area in a form of the slow write, the method further includes: updating the write speed mark to the slow write.

With reference to any one of the fourth aspect or the foregoing possible implementations of the fourth aspect, in a sixth possible implementation of the fourth aspect, after the obtaining historical access information of the to-be-accessed storage area, the method further includes: performing a read operation on the to-be-accessed storage area according to the write speed mark, where the fast write corresponds to a slow read, and the slow write corresponds to a fast read.

A corresponding form of a read operation is used according to a form of a write operation on the data in the to-be-accessed storage area. This can reduce a time of the read operation to some extent, and improve an overall access speed of the flash memory device.

With reference to any one of the fourth aspect or the foregoing possible implementations of the fourth aspect, in a seventh possible implementation of the fourth aspect, before the rewriting the data stored in the to-be-accessed storage area to the to-be-accessed storage area in a form of the slow write, the method further includes: saving address information of the to-be-accessed storage area in a rewrite queue; and reading, from the to-be-accessed storage area according to the address information saved in the rewrite queue, the data stored in the to-be-accessed storage area.

The address information of the to-be-accessed storage area in which a rewrite needs to be performed is written to a rewrite queue, and a rewrite operation is performed when the flash memory device is idle or has relatively light load, thereby avoiding that the rewrite operation blocks normal read access and normal write access.

Optionally, the data that is read may also be directly rewritten to the to-be-accessed storage area after the current read operation ends, thereby avoiding consumption caused by a subsequent reread.

According to a fifth aspect, the present invention provides a readable medium, including an execution instruction. When a processor of a storage controller executes the execution instruction, the storage controller performs the method in any one of the foregoing aspects or the possible implementations of the foregoing aspects.

According to a sixth aspect, the present invention provides a storage controller, including a processor, a memory, and a bus. The memory is configured to store an execution instruction; the processor and the memory are connected by using the bus; and when the storage controller runs, the processor executes the execution instruction stored in the memory, so that the storage controller performs the method in any one of the foregoing aspects or the possible implementations of the foregoing aspects.

According to a seventh aspect, the present invention provides an apparatus for accessing a flash memory device. A type of access to a flash memory device includes a write operation and a read operation, a form of the write operation on the flash memory device includes a fast write and a slow write, and a write speed of the fast write is greater than a write speed of the slow write. The apparatus includes: a receiving unit, configured to receive a first write access request for a to-be-accessed storage area; an obtaining unit, configured to obtain a historical access type of the to-be-accessed storage area, where the historical access type is an access type of access to the to-be-accessed storage area before the first write access request; and a writing unit, configured to: when the historical access type of the to-be-accessed storage area is a write operation, write to-be-written data of the first write access request to the to-be-accessed storage area in a form of the fast write.

With reference to the seventh aspect, in a first possible implementation of the seventh aspect, that the obtaining unit is configured to obtain a historical access type of the to-be-accessed storage area includes: the obtaining unit is configured to search for the historical access type that is of the to-be-accessed storage area and that is recorded in a historical access record.

With reference to any one of the seventh aspect or the foregoing possible implementation of the seventh aspect, in a second possible implementation of the seventh aspect, before receiving the first write access request for the to-be-accessed storage area, the receiving unit is further configured to receive a second write access request for the to-be-accessed storage area, where the second write access request is a first-time write access request for the to-be-accessed storage area; and the writing unit is further configured to: write to-be-written data of the second write access request to the to-be-accessed storage area, and record the historical access type of the to-be-accessed storage area in the historical access record.

With reference to any one of the seventh aspect or the foregoing possible implementations of the seventh aspect, in a third possible implementation of the seventh aspect, that the writing unit is configured to write to-be-written data of the second write access request to the to-be-accessed storage area includes: the writing unit is configured to write the to-be-written data of the second write access request to the to-be-accessed storage area in a form of the slow write.

With reference to any one of the seventh aspect or the foregoing possible implementations of the seventh aspect, in a fourth possible implementation of the seventh aspect, the apparatus further includes a deleting unit, where when it is determined that the data in the to-be-accessed storage area is invalid, the deleting unit is configured to delete the recorded historical access type of the to-be-accessed storage area.

With reference to any one of the seventh aspect or the foregoing possible implementations of the seventh aspect, in a fifth possible implementation of the seventh aspect, the writing unit is further configured to: when the historical access type of the to-be-accessed storage area is not a write operation, write the to-be-written data of the first write access request to the to-be-accessed storage area in the form of the slow write, and update the historical access type of the to-be-accessed storage area.

With reference to any one of the seventh aspect or the foregoing possible implementations of the seventh aspect, in a sixth possible implementation of the seventh aspect, the form of the write operation further includes a normal write, and a write speed of the normal write is greater than the write speed of the slow write and is less than the write speed of the fast write; and the writing unit is further configured to: when the historical access type of the to-be-accessed storage area is not a write operation, write the to-be-written data of the first write access request to the to-be-accessed storage area in a form of the normal write, and update the historical access type of the to-be-accessed storage area.

The seventh aspect is an apparatus implementation corresponding to the method in the second aspect. Therefore, the description of any one of the second aspect or the possible implementations of the second aspect is correspondingly applicable to any one of the seventh aspect or the possible implementations of the seventh aspect. Details are not described herein again.

According to an eighth aspect, the present invention provides an apparatus for accessing a flash memory device. A type of access to a flash memory device includes a write operation and a read operation. A form of the write operation on the flash memory device includes a fast write and a slow write, and a write speed of the fast write is greater than a write speed of the slow write. A form of the read operation on the flash memory device includes a fast read and a slow read, and a read speed of the fast read is greater than a read speed of the slow read. The apparatus includes: a receiving unit, configured to receive a read access request for a to-be-accessed storage area; a reading unit, configured to perform a read operation on the to-be-accessed storage area in a form of the fast read; an obtaining unit, configured to obtain a historical access type of the to-be-accessed storage area, where the historical access type is an access type of access to the to-be-accessed storage area before the read access request; and a writing unit, configured to: when decoding using the fast read fails and the historical access type is a read operation, rewrite data stored in the to-be-accessed storage area to the to-be-accessed storage area in a form of the slow write.

With reference to the eighth aspect, in a first possible implementation of the eighth aspect, that the obtaining unit is configured to obtain a historical access type of the to-be-accessed storage area includes: the obtaining unit is configured to search for the historical access type that is of the to-be-accessed storage area and that is recorded in a historical access record.

With reference to any one of the eighth aspect or the foregoing possible implementation of the eighth aspect, in a second possible implementation of the eighth aspect, before receiving the read access request for the to-be-accessed storage area, the receiving unit is further configured to receive a second write access request for the to-be-accessed storage area, where the second write access request is a first-time write access request for the to-be-accessed storage area; and the writing unit is further configured to: write to-be-written data of the second write access request to the to-be-accessed storage area, and record the historical access type of the to-be-accessed storage area in the historical access record.

With reference to any one of the eighth aspect or the foregoing possible implementations of the eighth aspect, in a third possible implementation of the eighth aspect, that the writing unit is configured to write to-be-written data of the second write access request to the to-be-accessed storage area includes: the writing unit is configured to write the to-be-written data of the second write access request to the to-be-accessed storage area in the form of the slow write.

With reference to any one of the eighth aspect or the foregoing possible implementations of the eighth aspect, in a fourth possible implementation of the eighth aspect, the apparatus further includes a deleting unit, where when it is determined that the data in the to-be-accessed storage area is invalid, the deleting unit is configured to delete the recorded historical access type of the to-be-accessed storage area.

With reference to any one of the eighth aspect or the foregoing possible implementations of the eighth aspect, in a fifth possible implementation of the eighth aspect, the reading unit is further configured to: when decoding using the fast read fails, perform a read operation on the to-be-accessed storage area in a form of the slow read.

With reference to any one of the eighth aspect or the foregoing possible implementations of the eighth aspect, in a sixth possible implementation of the eighth aspect, the form of the read operation further includes a normal read, and a read speed of the normal read is greater than the read speed of the slow read and is less than the read speed of the fast read; and the reading unit is further configured to: when decoding using the fast read fails, perform a read operation on the to-be-accessed storage area in a form of the normal read.

With reference to any one of the eighth aspect or the foregoing possible implementations of the eighth aspect, in a seventh possible implementation of the eighth aspect, the writing unit is further configured to: when the historical access type is not a read operation, update the historical access type.

With reference to any one of the eighth aspect or the foregoing possible implementations of the eighth aspect, in an eighth possible implementation of the eighth aspect, before rewriting the data stored in the to-be-accessed storage area to the to-be-accessed storage area in the form of the slow write, the writing unit is further configured to save address information of the to-be-accessed storage area in a rewrite queue; and the reading unit is further configured to read, from the to-be-accessed storage area according to the address information saved in the rewrite queue, the data stored in the to-be-accessed storage area.

The eighth aspect is an apparatus implementation corresponding to the method in the third aspect. Therefore, the description of any one of the third aspect or the possible implementations of the third aspect is correspondingly applicable to any one of the eighth aspect or the possible implementations of the eighth aspect. Details are not described herein again.

According to a ninth aspect, the present invention provides an apparatus for accessing a flash memory device. A type of access to the flash memory device includes a write operation and a read operation. A form of the write operation on the flash memory device includes a fast write and a slow write, and a write speed of the fast write is greater than a write speed of the slow write. The apparatus includes: a receiving unit, configured to receive a read access request for a to-be-accessed storage area; an obtaining unit, configured to obtain historical access information of the to-be-accessed storage area, where the historical access information includes a historical access type and a write speed mark of the to-be-accessed storage area, the write speed mark is used to indicate a form of a write operation on data stored in the to-be-accessed storage area, and the historical access type is an access type of access to the to-be-accessed storage area before the read access request; and a writing unit, configured to: when the historical access type is a read operation and the write speed mark does not indicate the slow write, rewrite the data stored in the to-be-accessed storage area to the to-be-accessed storage area in a form of the slow write.

With reference to the ninth aspect, in a first possible implementation of the ninth aspect, that the obtaining unit is configured to obtain historical access information of the to-be-accessed storage area includes: the obtaining unit is configured to search for the historical access information that is of the to-be-accessed storage area and that is recorded in a historical access record.

With reference to any one of the ninth aspect or the foregoing possible implementation of the ninth aspect, in a second possible implementation of the ninth aspect, before receiving the read access request for the to-be-accessed storage area, the receiving unit is further configured to receive a second write access request for the to-be-accessed storage area, where the second write access request is a first-time write access request for the to-be-accessed storage area; and the writing unit is further configured to: write to-be-written data of the second write access request to the to-be-accessed storage area, and record the historical access information of the to-be-accessed storage area in the historical access record.

With reference to any one of the ninth aspect or the foregoing possible implementations of the ninth aspect, in a third possible implementation of the ninth aspect, that the writing unit is configured to write to-be-written data of the second write access request to the to-be-accessed storage area includes: the writing unit is configured to write the to-be-written data of the second write access request to the to-be-accessed storage area in the form of the slow write.

With reference to any one of the ninth aspect or the foregoing possible implementations of the ninth aspect, in a fourth possible implementation of the ninth aspect, the apparatus further includes a deleting unit, where when it is determined that the data in the to-be-accessed storage area is invalid, the deleting unit is configured to delete the recorded historical access information of the to-be-accessed storage area.

With reference to any one of the ninth aspect or the foregoing possible implementations of the ninth aspect, in a fifth possible implementation of the ninth aspect, after rewriting the data stored in the to-be-accessed storage area to the to-be-accessed storage area in the form of the slow write, the writing unit is further configured to update the write speed mark to the slow write.

With reference to any one of the ninth aspect or the foregoing possible implementations of the ninth aspect, in a sixth possible implementation of the ninth aspect, the apparatus further includes a reading unit, where after the obtaining unit obtains historical access information of the to-be-accessed storage area, the reading unit is configured to perform a read operation on the to-be-accessed storage area according to the write speed mark, where the fast write corresponds to a slow read, and the slow write corresponds to a fast read.

With reference to any one of the ninth aspect or the foregoing possible implementations of the ninth aspect, in a seventh possible implementation of the ninth aspect, the apparatus further includes the reading unit, where before rewriting the data stored in the to-be-accessed storage area to the to-be-accessed storage area in the form of the slow write, the writing unit is further configured to save address information of the to-be-accessed storage area in a rewrite queue; and the reading unit is configured to read, from the to-be-accessed storage area according to the address information saved in the rewrite queue, the data stored in the to-be-accessed storage area.

The ninth aspect is an apparatus implementation corresponding to the method in the fourth aspect. Therefore, the description of any one of the fourth aspect or the possible implementations of the fourth aspect is correspondingly applicable to any one of the ninth aspect or the possible implementations of the ninth aspect. Details are not described herein again.

According to a tenth aspect, the present invention provides a flash memory device. A type of access to a flash memory device includes a write operation and a read operation, a form of the write operation on the flash memory device includes a fast write and a slow write, and a write speed of the fast write is greater than a write speed of the slow write. The flash memory device includes a storage controller and a flash memory array, where the flash memory array is configured to store data; and the storage controller is configured to: receive a first write access request for a to-be-accessed storage area of the flash memory array; obtain a historical access type of the to-be-accessed storage area, where the historical access type is an access type of access to the to-be-accessed storage area before the first write access request; and when the historical access type of the to-be-accessed storage area is a write operation, write to-be-written data of the first write access request to the to-be-accessed storage area in a form of the fast write.

With reference to the tenth aspect, in a first possible implementation of the tenth aspect, the storage controller is further configured to: when the historical access type of the to-be-accessed storage area is not a write operation, write the to-be-written data of the first write access request to the to-be-accessed storage area in a form of the slow write, and update the historical access type of the to-be-accessed storage area.

With reference to the tenth aspect, in a second possible implementation of the tenth aspect, the form of the write operation further includes a normal write, and a write speed of the normal write is greater than the write speed of the slow write and is less than the write speed of the fast write; and the storage controller is further configured to: when the historical access type of the to-be-accessed storage area is not a write operation, write the to-be-written data of the first write access request to the to-be-accessed storage area in a form of the normal write, and update the historical access type of the to-be-accessed storage area.

The tenth aspect is an apparatus implementation corresponding to the method in the second aspect. Therefore, the description of any one of the second aspect or the possible implementations of the second aspect is correspondingly applicable to any one of the tenth aspect or the possible implementations of the tenth aspect. Details are not described herein again.

According to an eleventh aspect, the present invention provides a flash memory device. A type of access to the flash memory device includes a write operation and a read operation. A form of the write operation on the flash memory device includes a fast write and a slow write, and a write speed of the fast write is greater than a write speed of the slow write. A form of the read operation on the flash memory device includes a fast read and a slow read, and a read speed of the fast read is greater than a read speed of the slow read. The apparatus includes a storage controller and a flash memory array, where the flash memory array is configured to store data; and the storage controller is configured to: receive a read access request for a to-be-accessed storage area of the flash memory array; perform a read operation on the to-be-accessed storage area in a form of the fast read; obtain a historical access type of the to-be-accessed storage area, where the historical access type is an access type of access to the to-be-accessed storage area before the read access request; and when decoding using the fast read fails and the historical access type is a read operation, rewrite data stored in the to-be-accessed storage area to the to-be-accessed storage area in a form of the slow write.

With reference to the eleventh aspect, in a first possible implementation of the eleventh aspect, the storage controller is further configured to: when decoding using the fast read fails, perform a read operation on the to-be-accessed storage area in a form of the slow read.

With reference to the eleventh aspect, in a second possible implementation of the eleventh aspect, the form of the read operation further includes a normal read, and a read speed of the normal read is greater than the read speed of the slow read and is less than the read speed of the fast read; and the storage controller is further configured to: when decoding using the fast read fails, perform a read operation on the to-be-accessed storage area in a form of the normal read.

The eleventh aspect is an apparatus implementation corresponding to the method in the third aspect. Therefore, the description of any one of the third aspect or the possible implementations of the third aspect is correspondingly applicable to any one of the eleventh aspect or the possible implementations of the eleventh aspect. Details are not described herein again.

According to a twelfth aspect, the present invention provides a flash memory device. A type of access to the flash memory device includes a write operation and a read operation. A form of the write operation on the flash memory device includes a fast write and a slow write, and a write speed of the fast write is greater than a write speed of the slow write. The apparatus includes a storage controller and a flash memory array, where the flash memory array is configured to store data; and the storage controller is configured to: receive a read access request for a to-be-accessed storage area; obtain historical access information of the to-be-accessed storage area, where the historical access information includes a historical access type and a write speed mark of the to-be-accessed storage area, the write speed mark is used to indicate a form of a write operation on data stored in the to-be-accessed storage area, and the historical access type is an access type of access to the to-be-accessed storage area before the read access request; and when the historical access type is a read operation and the write speed mark does not indicate the slow write, rewrite the data stored in the to-be-accessed storage area to the to-be-accessed storage area in a form of the slow write.

With reference to the twelfth aspect, in a first possible implementation of the twelfth aspect, after rewriting the data stored in the to-be-accessed storage area to the to-be-accessed storage area in the form of the slow write, the storage controller is further configured to update the write speed mark to the slow write.

With reference to any one of the twelfth aspect or the foregoing possible implementation of the twelfth aspect, in a second possible implementation of the twelfth aspect, after obtaining the historical access information of the to-be-accessed storage area, the storage controller is further configured to perform a read operation on the to-be-accessed storage area according to the write speed mark, where a form of the read operation on the flash memory device includes a fast read and a slow read, a read speed of the fast read is greater than a read speed of the slow read, the fast write corresponds to the slow read, and the slow write corresponds to the fast read.

The twelfth aspect is an apparatus implementation corresponding to the method in the fourth aspect. Therefore, the description of any one of the fourth aspect or the possible implementations of the fourth aspect is correspondingly applicable to any one of the twelfth aspect or the possible implementations of the twelfth aspect. Details are not described herein again.

According to the technical solutions disclosed in the embodiments of the present invention, based on an access characteristic of data, data is classified into three types: read-only data, write-only data, and cross-access data, and the three types of data are distinguished from one another by using a historical access type. Therefore, a speed for data having a read-only characteristic is regulated, and a slow write is performed to achieve a fast read, so that read performance is greatly improved while write performance is almost not affected. A speed for data having a write-only characteristic is regulated, and a fast write is performed, so that write performance is greatly improved while read performance is almost not affected. Further, a speed for data having a cross-access characteristic may also be regulated, and a normal write is performed, thereby achieving a balance between a read speed and a write speed.

BRIEF DESCRIPTION OF DRAWINGS

To describe the technical solutions in the embodiments of the present invention more clearly, the following briefly describes the accompanying drawings required for describing the embodiments. Apparently, the accompanying drawings in the following description show merely some embodiments of the present invention, and persons of ordinary skill in the art may still derive other drawings from these accompanying drawings without creative efforts.

DESCRIPTION OF EMBODIMENTS

The following describes the embodiments of the present invention with reference to the accompanying drawings.

Figure 1:
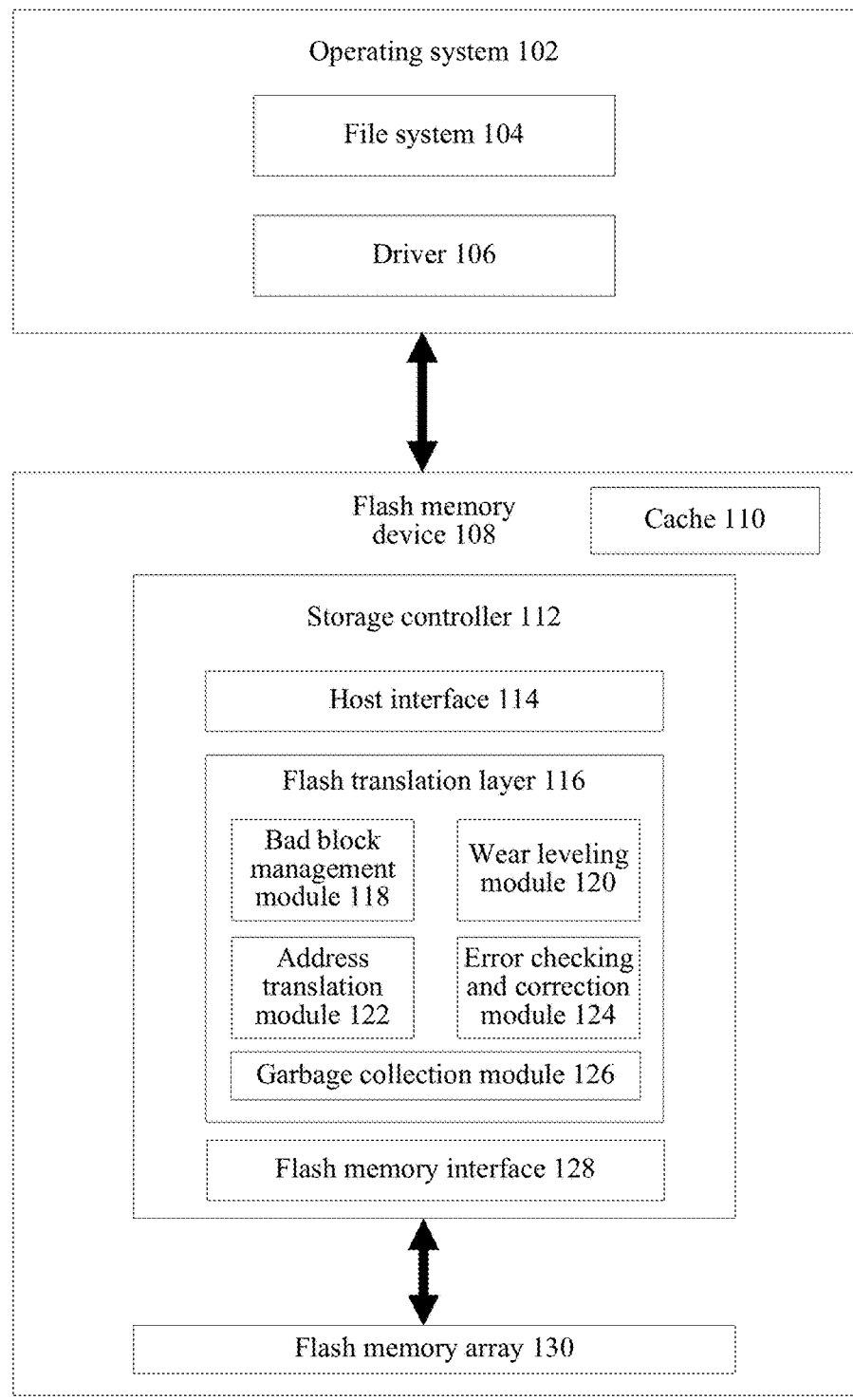
FIG. 1 is a schematic diagram of a logical structure of a data access system.

FIG. 1 is a schematic diagram of a logical structure of a system 100 for accessing a flash memory device according to an embodiment of the present invention. As shown in FIG. 1, the system 100 includes an operating system 102 and a flash memory device 108.

The operating system 102 includes various software components and/or drivers that are used to control and manage routine system tasks (such as memory management, storage device control, and power management) and facilitate communication among various software and hardware components. The operating system 102 may be Darwin, RTXC, Linux, Unix, OS X, MAC OS, or Windows, or an embedded operating system such as VxWorks. This is not limited in this embodiment of the present invention.

Specifically, the operating system 102 includes a file system 104 and a driver 106. The file system 104 is a method and a data structure that are used by the operating system 102 to specify files on the flash memory device 108, that is, a method for organizing files on the flash memory device 108. The file system 104 may be of any type such as FAT, NTFS, exFAT, RAW, Ext2, Ext3, Ext4, Btrfs, ZFS, HFS, HFS+, ReiserFS, JFS, VMFS, XFSUFS, or VXFS.

An application program of a user runs in the operating system 102. The application program implements human-machine interaction by accessing underlying hardware. The driver 106 is a bridge for interaction between the application program and the hardware. On one hand, the application program controls the hardware by sending a corresponding instruction to the driver 106. On the other hand, the driver 106 transfers, to the application program, read and write statuses of the hardware and data obtained from the hardware, thereby implementing interaction between the application program and the underlying hardware.

The operating system 102 is connected to the flash memory device 108 by using a hard disk drive interface technology (ATA).

The flash memory device 108 is a storage device based on a flash memory; for example, the flash memory device 108 may be an SSD. The flash memory device 108 includes a cache 110, a storage controller 112, and a flash memory array 130.

The storage controller 112 includes a host interface 114, a flash translation layer (FTL) 116, and a flash memory interface 128.

The host interface 114 is configured to connect to a host, and control data transmission with the operating system 102.

The flash memory interface 128 is configured to connect to the flash memory array 130, and control data transmission with the flash memory array 130.

The flash translation layer 116 includes a bad block management (BBM) module 118, a wear leveling (WL) module 120, an address translation module 122, an error checking and correction (ECC) module 124, and a garbage collection (GC) module 126.

The flash memory array 130 may be divided into multiple blocks, and each block may be further divided into multiple pages. Data may be directly written in pages. However, data needs to be erased in blocks. New data cannot be written before existing data is erased. However, the operating system 102 usually reads and writes data according to a size of a sector of a hard disk drive (HDD). Consequently, an SSD cannot be managed by using the file system 104 currently used by the operating system 102, and the file system 104 needs to be replaced with a more advanced and complex file system to resolve this problem. However, in this case, the load on the operating system 102 increases. To avoid increasing the load on the operating system 102, the flash memory device 108 uses software to virtualize an operation on the flash memory array 130 into an operation on an independent sector of a magnetic disk. This is a function of the flash translation layer 116.

The flash translation layer 116 exists between the file system 104 and a physical medium (the flash memory array 130). The operating system 102 only needs to operate a logical block address (LBA) as usual. The flash translation layer 116 is responsible for all work of translation from a logical address into a physical block address (PBA).

The bad block management module 118 is configured to manage a bad block of the flash memory array 130. An unstable block that is in the flash memory array 130 and that cannot ensure accuracy of data during a read/write or an erasure is referred to as a bad block. The bad block management module 118 manages a bad block by using a bad block table. After the bad block table is created, the bad block management module 118 saves the bad block table in a good block, and after each restart, loads the bad block table from inside the block to the cache 110. A write is performed on the flash memory array 130 in pages. During the operation, data in another page in the block may be affected. Therefore, when an error occurs during a write, the bad block management module 118 replaces the bad block with a good block, rewrites the data to the new good block, copies all data in remaining valid pages in the detected bad block to the new block, marks the former block as a bad block, updates an address in the bad block table, and remaps an address of the original bad block to the new good block.

A life of the flash memory array 130 is calculated according to a quantity of programming/erasure times, and the wear leveling module 120 is a mechanism for ensuring that each block in the flash memory array 130 has a same quantity of write times. Without this mechanism, flash memory chips in the flash memory array 130 cannot reach a lifecycle at the same time. Data of a user in a logical address space have different update speeds. Some data needs to be frequently updated, and some data does not need to be changed for a long time. Therefore, without the WL mechanism, a life of a flash memory chip in which frequently updated data is located ends first, and a flash memory chip in which the relatively infrequently changed data is located has a low wear degree. To avoid this situation, the WL mechanism is needed to maintain relatively equal wear degrees of flash memory chips in the flash memory array 130.

Specifically, the wear leveling module 120 works together with the address translation module 122. Each time an application program in the operating system 102 rewrites or updates a same logical address, the address translation module 122 dynamically maps the logical address to another different physical address, and saves the mapping relationship in a specific "address mapping table". An expired physical address is marked as "invalid", and waits for a subsequent erasure operation. The wear leveling module 120 controls programming/erasure frequency of each storage chip in this mapping process. In this way, all physical blocks can be controlled to be within a same wear range and to "age" at the same time.

The error checking and correction module 124 is configured to detect and correct an error during data reading. When data is written, the error checking and correction module 124 inside the storage controller 112 generates an ECC signature according to the data. The ECC signature is generally stored in a spare area (SA) in the final part of a flash memory page. When the data is read from the flash memory page, the error checking and correction module 124 reads the ECC signature, and determines, according to the read data and the ECC signature, whether an error occurs in the data. If it is detected that the read data includes an error bit, the detected error needs to be corrected by using an ECC algorithm. The ECC algorithm may be BCH encoding, LDPC encoding, or the like. The LDPC encoding is used to describe the solution in this embodiment of the present invention. However, it should be understood that an encoding algorithm used for ECC is not limited in this embodiment of the present invention.

The garbage collection module 126 is specifically configured to copy data in a "valid" page in a flash memory block to another data block, and completely erase the data in the former data block. Different from a conventional HDD, original data cannot be directly overwritten in the flash memory array 130. In the flash memory device 108, old data needs to be erased before new data can be written. For the flash memory array 130, garbage collection refers to a process in which existing data is moved to another flash memory location and some useless data is completely erased. Data may be directly written to the flash memory array 130 in pages, but data needs to be erased from the flash memory array 130 in blocks. Therefore, to erase useless data, in the flash memory array 130, first, useful data included in a block needs to be copied to a page in another block. In this way, useless data included in the original block can be erased in blocks. The erasure needs to be performed before new data can be written.

Optionally, the flash memory device 108 further supports a trim function. Trim is an ATA instruction, and the operating system 102 sends the instruction to the storage controller 112, so as to notify the storage controller 112 of data that occupies "invalid" addresses. When a user deletes a file in the operating system 102, the operating system 102 does not actually delete data of the file; instead, the operating system 102 only marks the addresses occupied by the data as "invalid". That is, the data at the addresses can be overwritten for use. However, this is only an operation at the layer of the file system 104. The flash memory device 108 does not know specific addresses at which data is already "invalid", until the operating system 102 notifies the flash memory device 108 that new data is to be written at these addresses. The flash memory array 130 does not allow an overwrite, and an erasure needs to be performed before a write can be performed. To obtain an "idle" flash memory block to perform a write, without the trim mechanism, the storage controller 112 cannot know in advance which "deleted" data pages are already "invalid", and knows which data can be erased only when the operating system 102 requires to write data at a same location. Therefore, utmost optimization cannot be performed at a most appropriate moment. Consequently, efficiency of GC is affected, and a life of the flash memory array 130 is affected.

The cache 110 is configured to store data such as a bad block table or an "address mapping table" that is about a mapping from a logical address to a physical address during a start. The storage controller 112 saves the bad block table, the "address mapping table", and the like in the flash memory array 130. After each restart, the storage controller 112 loads the data such as the bad block table and the "address mapping table" to the cache 110 from the flash memory array 130.

The flash memory array 130 may be divided into multiple blocks, and each block (block) may further be divided into multiple pages. Data may be directly written in pages, and may be erased in blocks. Old data needs to be erased before new data can be written.

The flash memory array 130 may use a single-level cell (SLC) or a multi-level cell (MLC). Each SLC cell stores information of one bit, and each MLC cell may store data of more than one bit. This is not limited in this embodiment of the present invention.

It should be understood that FIG. 1 is merely used to describe participants of the system 100 and relationships between the participants as an example. Therefore, the described system 100 is greatly simplified. The system 100 is only generally described in this embodiment of the present invention. In actual use, the system 100 may include more or fewer components. This embodiment of the present invention does not impose any limitation on an implementation of the system 100.

Figure 2:
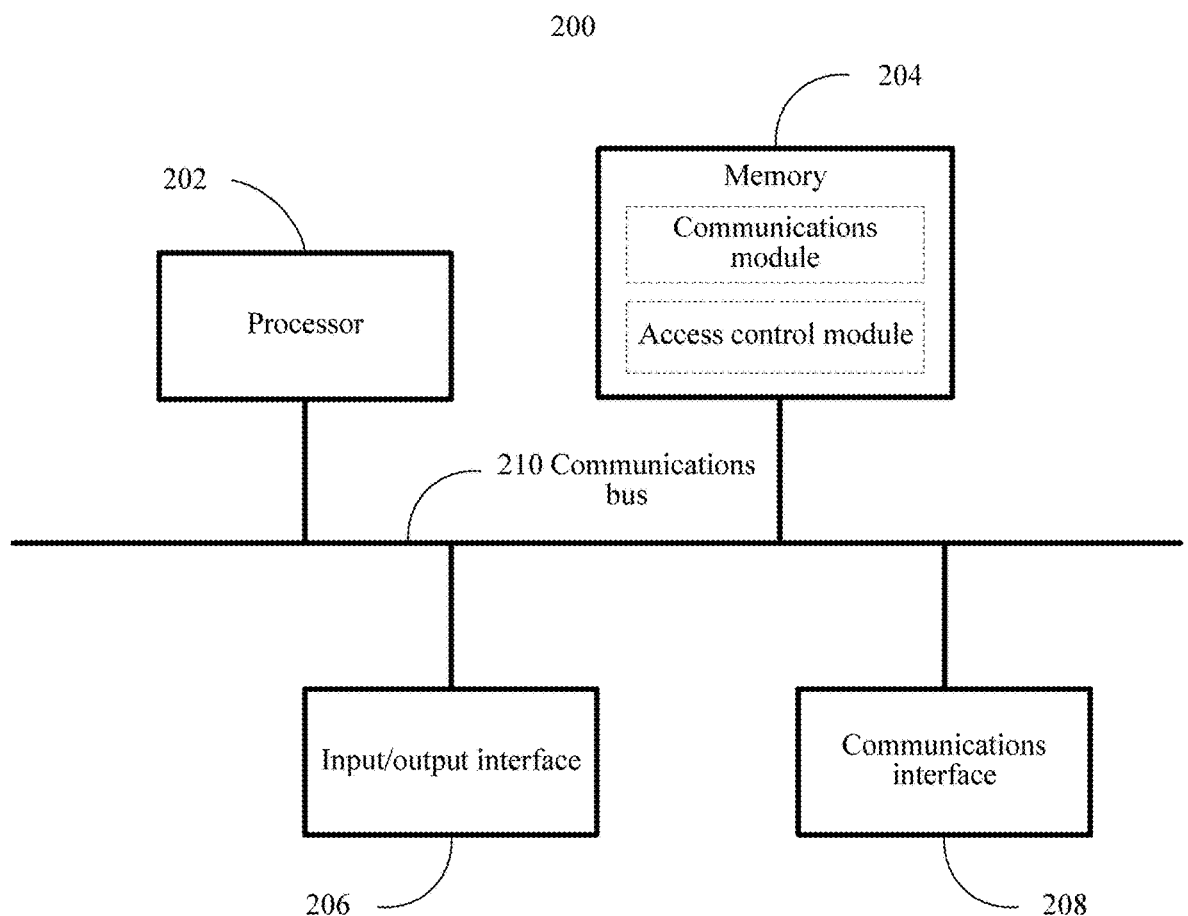
FIG. 2 is a schematic diagram of a hardware structure of a storage controller according to an embodiment of the present invention.

FIG. 2 is a schematic diagram of a hardware structure of a storage controller 200 according to an embodiment of the present invention. As shown in FIG. 2, the storage controller 200 includes a processor 202, a memory 204, an input/output interface 206, a communications interface 208, and a bus 210. The processor 202, the memory 204, the input/output interface 206, and the communications interface 208 communicate with and connect to each other by using the bus 210.

The processor 202 is a control center of the storage controller 200, and is configured to execute a related program to implement the technical solution provided in this embodiment of the present invention. The processor 202 may be a general-purpose central processing unit (CPU), a microprocessor, an application-specific integrated circuit (ASIC), or one or more integrated circuits, so as to execute a related program to implement the technical solution provided in this embodiment of the present invention. Unless otherwise described, in the present invention, a component configured to execute a specific function, for example, the processor 202 or the memory 204, may be implemented by configuring a universal component to execute the corresponding function, or may be implemented by using a dedicated component that specially executes the specific function. This is not limited in the present invention.

The memory 204 may be a read-only memory (ROM), a static storage device, a dynamic storage device, or a random access memory (RAM). The memory 204 may store an operating system and another application program. When the technical solution provided in this embodiment of the present invention is implemented by means of software or firmware, program code for implementing the technical solution provided in this embodiment of the present invention is stored in the memory 204 and is executed by the processor 202. The memory 204 may be integrated with the processor 202 or integrated in the processor 202, or may be one or more storage units independent from the processor 202.

The program code to be executed by the processor 202 may be stored in a flash memory or the memory 204 connected to the processor 202. Optionally, the memory 204 is a RAM, and the program code (for example, a communications module or an access control module) stored in the flash memory is copied to the memory 204 for execution by the processor 202.

The memory 204 is further configured to store a bad block table and an address mapping table or another mapping table in this embodiment of the present invention. More specifically, when a system starts, the storage controller 200 loads a bad block table and an address mapping table or another mapping table stored in the flash memory to the memory 204 for use by the processor 202.

As shown in FIG. 2, the memory 204 of the storage controller 200 includes an access control module. The processor 202 executes program code of the access control module, so as to implement access to the flash memory device.

Optionally, the memory 204 further includes one or more of the bad block management module 118, the wear leveling module 120, the address translation module 122, the error checking and correction module 124, or the garbage collection module 126 in the storage controller 112 in FIG. 1.

The input/output interface 206 is configured to: receive data and information that are input, and output data such as an operation result.

The communications interface 208 uses, for example, but not limited to, a transceiver apparatus such as a transceiver, to implement communication between the storage controller 200 and another device or a communications network.

The bus 210 may include a path for transferring information among the components (for example, the processor 202, the memory 204, the input/output interface 206, and the communications interface 208) of the storage controller 200.

It should be noted that, although only the processor 202, the memory 204, the input/output interface 206, the communications interface 208, and the bus 210 are shown for the storage controller 200 shown in FIG. 2, in a specific implementation process, persons skilled in the art should understand that, the storage controller 200 further includes another device essential for normal operation. In addition, according to a specific requirement, persons skilled in the art should understand that the storage controller 200 may further include a hardware device for implementing another additional function. In addition, persons skilled in the art should understand that the storage controller 200 may also include only a device essential for implementation of this embodiment of the present invention, rather than all the devices shown in FIG. 2.

The hardware structure shown in FIG. 2 and the foregoing description are applicable to various apparatuses and systems for accessing a flash memory device that are provided in the embodiments of the present invention, and are suitable for performing various methods for accessing a flash memory device that are provided in the embodiments of the present invention.

Data is written to a flash memory in pages. A time of a write operation mainly includes two parts: a transmission time of data and a write time (that is, a programming operation) of the data. A transmission time of a page of data on a bus is constant, and the time of the write operation mainly depends on the time of the programming operation. Data is generally written to a flash memory in an ISPP programming manner. To enable a flash cell to reach a predetermined voltage, a programming voltage in each round is changed by increasing the voltage gradually by a step voltage, so as to charge the flash cell until the flash cell reaches a predetermined voltage value, where the step voltage is fixed.

Figure 3:
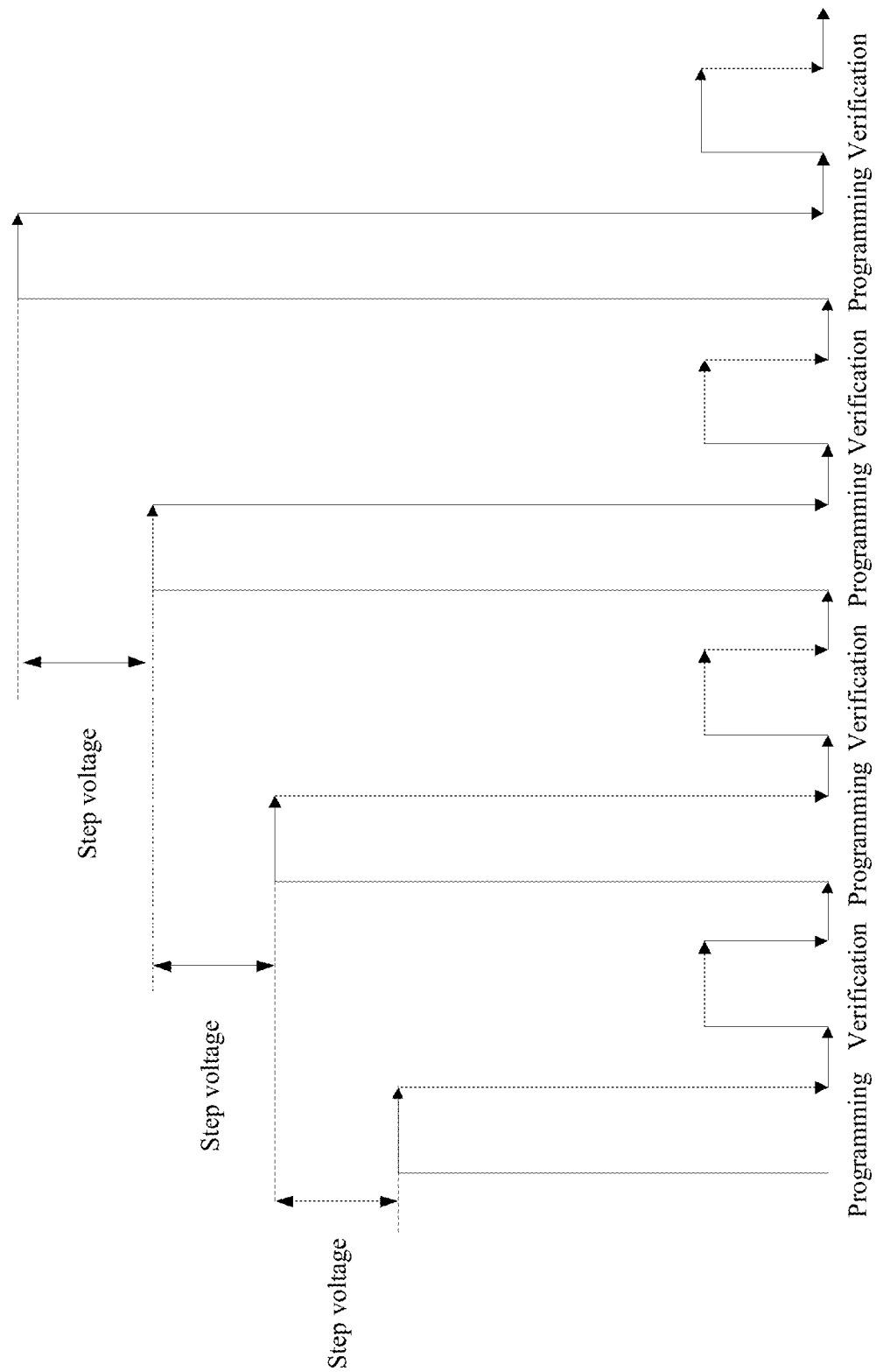
FIG. 3 is a schematic flowchart of ISPP programming according to an embodiment of the present invention.

Specifically, each round of iteration of an ISPP programming operation includes two parts: programming and verification. As shown in FIG. 3, during programming, a programming voltage is applied to a flash cell, so as to increase electric charge in the flash cell. A programming voltage at each time is kept on the flash cell for a period of time. During verification, a relatively low voltage is applied to determine whether the flash cell reaches a predetermined value. If the flash cell reaches the predetermined value, charging is completed, and programming is stopped. If the flash cell does not reach the predetermined value, the programming voltage is increased by one step voltage to continue charging the flash cell, until a write of data is completed.

There is a proportional relationship between such an iteration process and the step voltage. On one hand, when the step voltage is higher, a smaller quantity of iterations is needed to reach the predetermined voltage value. Therefore, a programming time is inversely proportional to the step voltage. On the other hand, there is another relationship between a programming step voltage and an error rate. When a step voltage is higher, programming accuracy is lower, and subsequently an error rate is higher. When a step voltage is lower, programming accuracy is higher, and subsequently an error rate is lower. Therefore, a step voltage for ISPP programming during a write operation affects an error rate of data during a subsequent read operation.

In this embodiment of the present invention, a form of a write operation on a flash memory device is classified according to different step voltages for ISPP programming. A write operation includes a fast write and a slow write. A write speed of the fast write is greater than a write speed of the slow write. That is, a step voltage for ISPP programming of the fast write is greater than a step voltage for ISPP programming of the slow write.

More specifically, the form of the write operation on the flash memory device may further include a normal write. A write speed of the normal write is greater than the write speed of the slow write and is less than the write speed of the fast write. That is, a step voltage for ISPP programming of the normal write is greater than the step voltage for ISPP programming of the slow write and is less than the step voltage for ISPP programming of the fast write.

It should be understood that, the "fast write" herein may be a fast write operation supported by the flash memory device, the "slow write" may be a slow write operation supported by the flash memory device, and the "normal write" is a write operation whose speed falls between that of the "slow write" and that of the "fast write". In this embodiment of the present invention, a flash memory device supports speeds of at least two types of write operations. A speed of a write operation is generally determined by a programming step voltage. A high programming step voltage corresponds to the fast write operation, and a low programming step voltage corresponds to a slow write operation. The fast write in this embodiment corresponds to a highest speed or a second highest speed among speeds of write operations on the flash memory device, and the slow write in this embodiment corresponds to a lowest speed or a second lowest speed among speeds of write operations on the flash memory device. For example, for a flash memory device supporting speeds of two types of write operations, a fast write is a write operation at a high speed, and a slow write is a write operation at a low speed. For a flash memory device supporting speeds of more than two types of write operations, a fast write is a write operation at a highest speed, a second highest speed, or a relatively high speed, and a slow write is a write operation at a lowest speed, a second lowest speed, or a relatively low speed.

A time of a read operation mainly includes two parts: a reading time of data and a transmission time of the data. There is a positive correlation between the reading time and a quantity of threshold voltages, and there is a positive correlation between the transmission time and a volume of transmitted data. It is assumed that there are N threshold voltages, and a voltage value on a flash cell of a flash memory is divided into N+1 areas, cell($Log_2$(N+1)) bits are needed to represent the N+1 voltage areas. There is a positive correlation between the reading time and N, there is a positive correlation between the transmission time and cell($Log_2$(N+1)), and cell( ) represents rounding up.

Figure 4:
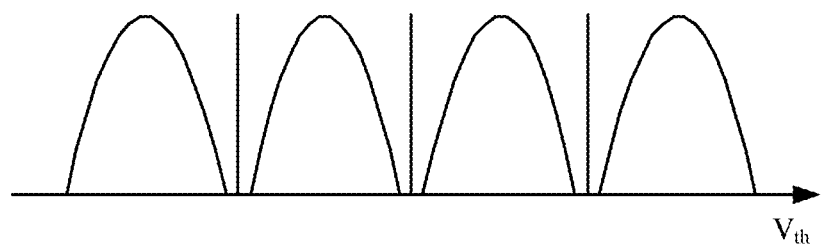
FIG. 4 is a distribution diagram of threshold voltages for hard decision according to an embodiment of the present invention.

An example in which an LDPC code is used as a check code and two-bit data is stored in a flash cell unit is used for description. For a read operation scheme, generally, LDPC hard decision decoding is used first. FIG. 4 shows distribution of threshold voltages for LDPC hard decision. There is only one threshold voltage between two adjacent states, and there are three threshold voltages in total between four states. During a read operation, a voltage on each flash cell of a data page that is read is compared with the three threshold voltages, so as to determine a status of the voltage on the flash cell. Because there are only three threshold voltages, a reading time is relatively short. Because the voltage on the flash cell is divided into four states, cell($Log_2$(4))=2 bits are needed to record information, and a transmission time is relatively short.

Figure 5:
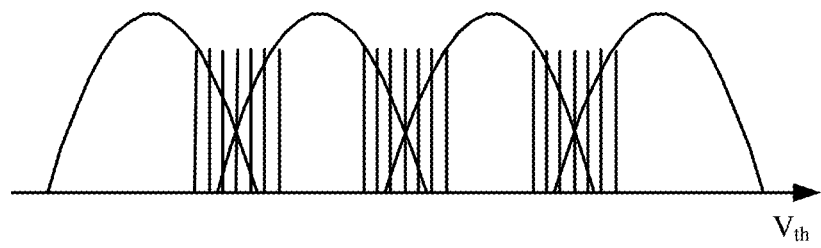
FIG. 5 is a distribution diagram of threshold voltages for soft decision according to an embodiment of the present invention.

If check succeeds, a read succeeds. On the contrary, if check fails, soft decision is used for decoding. FIG. 5 shows distribution of threshold voltages for LDPC soft decision. There are multiple threshold voltages between two adjacent states. An example in which there are seven threshold voltages between two states is used for description in FIG. 5. In this case, there are 21 threshold voltages in total for four states, and a voltage on a flash cell is divided into 22 areas. During a read operation, a voltage on each flash cell of a data page that is read is compared with the 21 threshold voltages, so as to determine a status of the voltage on the flash cell. In this case, a reading time of the read operation is relatively long. In addition, because the voltage on the flash cell is divided into 22 states, cell($Log_2$(22))=5 bits are needed to record information, and a transmission time is also relatively long. If decoding still fails, for the soft decision, a quantity of threshold voltages between adjacent states is gradually increased to improve reading accuracy, until information is correctly decoded.

It should be understood that, distribution of threshold voltages for soft decision is not limited to the example in FIG. 5. A quantity of threshold voltages between two adjacent states is variable, and determines a tolerable error rate of data for LDPC decoding. When the quantity of threshold voltages is larger, an error rate tolerable for correct decoding is higher.

It can be learned from the foregoing description that a step voltage for a slow write is relatively low, and accuracy of writing data is high. When a read operation is performed, correctness of reading the data from a flash memory is higher, and the data may be relatively easily succeed, but a write speed is low. A step voltage for the fast write is relatively high, and a write speed is high. However, accuracy of writing data is relatively low. When a read operation is performed, correctness of reading the data from the flash memory is relatively low, and the data in the flash memory can be accurately read only after multiple rounds of reads or iterations.

In this embodiment of the present invention, according to different quantities of threshold voltages between adjacent states, a form of a read operation on a flash memory includes a fast read and a slow read. A read speed of the fast read is greater than a read speed of the slow read. That is, a quantity of threshold voltages for the fast read is less than a quantity of threshold voltages for the slow read.

More specifically, the form of the read operation on the flash memory may further include a normal read. A read speed of the normal read is greater than the read speed of the slow read and is less than the read speed of the fast read. That is, a quantity of threshold voltages for the normal read is less than the quantity of threshold voltages for the slow read and greater than the quantity of threshold voltages for the fast read.

In this embodiment of the present invention, a flash memory device supports speeds of at least two types of read operations. A speed of a read operation is generally determined by a quantity of threshold voltages between adjacent states. A small quantity of threshold voltages between adjacent states corresponds to a fast read operation, and a large quantity of threshold voltages between adjacent states corresponds to a slow read operation. The fast read in this embodiment corresponds to a highest or a second highest speed among speeds of read operations on the flash memory device, and the slow read in this embodiment corresponds to a lowest or a second lowest speed among speeds of read operations on the flash memory device. For example, for a flash memory device supporting speeds of two types of read operations, a fast read is a read operation at a high speed, and a slow read is a read operation at a low speed. For a flash memory device supporting speeds of more than two types of read operations, a fast read is a read operation at a highest speed, a second highest speed, or a relatively high speed, and a slow read is a read operation at a lowest speed, a second lowest speed, or a relatively low speed.

According to this embodiment of the present invention, by analyzing access behavior for multiple pieces of data, it is found that accesses to a flash memory have particular characteristics. The accesses mainly have the following three characteristics:

(1) A read-only characteristic. Within a period of time, almost all accesses to a data page are read accesses. In this case, these read accesses have the read-only characteristic.

For example, after a media file is written, generally, a write access no longer occurs for the media file, and the media file is only read multiple times.

(2) A write-only characteristic. Within a period of time, almost all accesses to a data page are write accesses. In this case, these write accesses have the write-only characteristic. For example, a log file and metadata are usually repeatedly written, and are scarcely read.

(3) A cross-access characteristic. Within a period of time, there are both a read access and a write access to a data page. In this case, these accesses have the cross-access characteristic.

A flash memory has a characteristic in which data that is quickly written is read slowly and data that is slowly written is read quickly. Based on the characteristic, in this embodiment of the present invention, a write speed for a flash memory page is adjusted according to a characteristic of an access to the flash memory page, so as to improve read and write performance of a flash memory. A specific method is described in the following embodiment.

Figure 6:
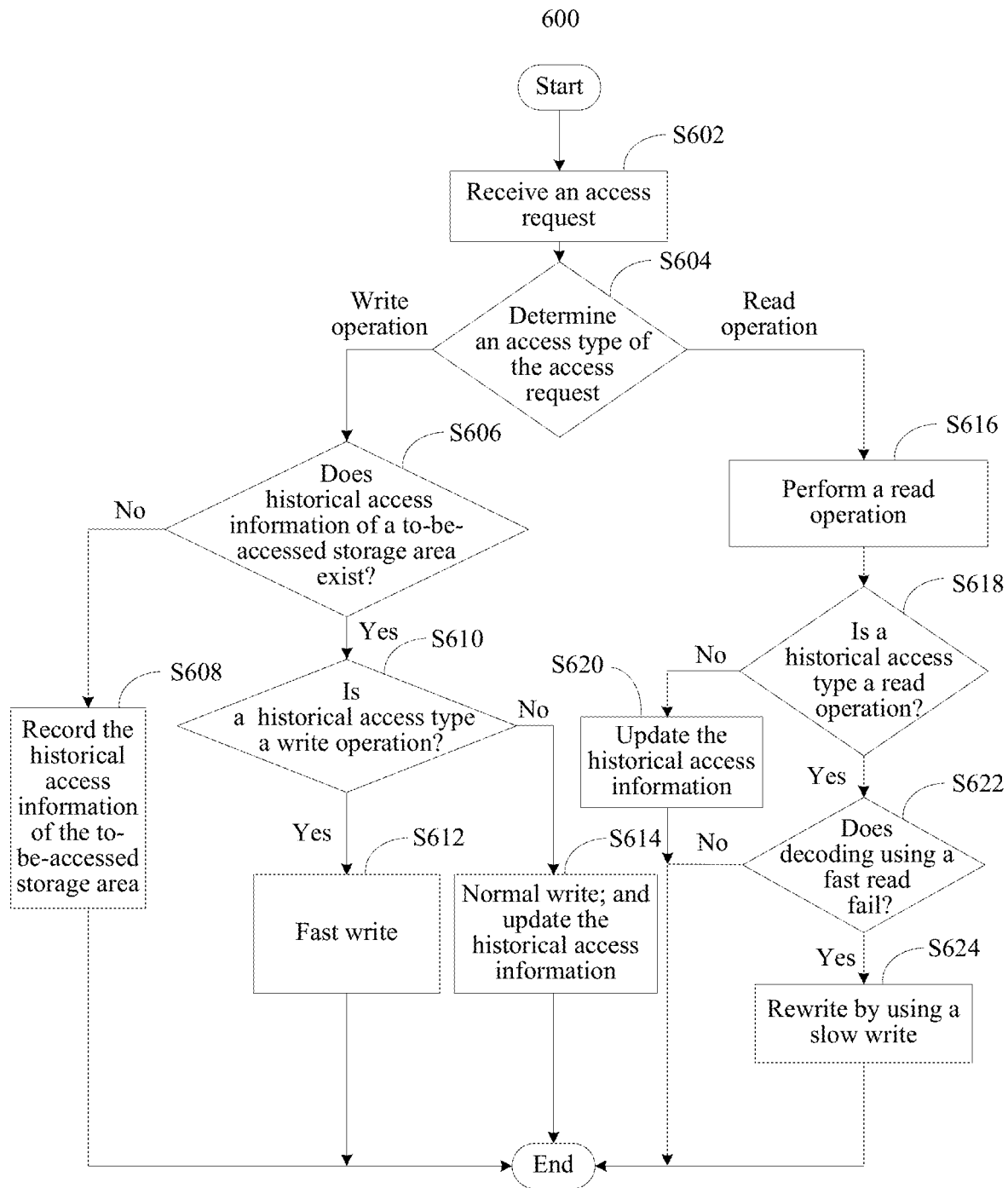
FIG. 6 is an example of a flowchart of a method for accessing a flash memory device according to an embodiment of the present invention.

FIG. 6 is a flowchart of a method 600 for accessing a flash memory device according to an embodiment of the present invention. A type of access to a flash memory device includes a write operation and a read operation. A form of the write operation on the flash memory device includes a fast write and a slow write, and a write speed of the fast write is greater than a write speed of the slow write. A form of the read operation on the flash memory device includes a fast read and a slow read, and a read speed of the fast read is greater than a read speed of the slow read. As shown in FIG. 6, the method 600 includes the following steps.

S602. A storage controller receives an access request from an operating system.

The access request indicates a to-be-accessed storage area. Specifically, the access request carries address information of the to-be-accessed storage area. The address information is a logical address of the to-be-accessed storage area. The to-be-accessed storage area in this embodiment of the present invention refers to a storage area indicated by the logical address. Original data cannot be directly overwritten in a flash memory page of a flash memory. Old data needs to be erased before new data can be written. Therefore, the address information in this embodiment of the present invention is the logical address of the to-be-accessed storage area, and the to-be-accessed storage area is correlated with the logical address. Because the flash memory cannot be overwritten, an actual physical address corresponding to a same logical address may be in a changing state.

S604. The storage controller determines an access type of the access request, where the type of access to the flash memory device includes a write operation and a read operation; and if the access type of the access request is a write operation, the storage controller performs step S606, or if the access type of the access request is a read operation, the storage controller performs step S616.

S606. The storage controller determines whether historical access information of the to-be-accessed storage area exists; and if the historical access information of the to-be-accessed storage area does not exist, the storage controller performs step S608, or if the historical access information of the to-be-accessed storage area exists, the storage controller performs step S610.

The storage controller searches a historical access record for the historical access information of the to-be-accessed storage area. The historical access information includes a historical access type of the to-be-accessed storage area, and the historical access type is an access type of access to the to-be-accessed storage area before the current access request.

Specifically, the historical access information may record a last historical access type to the to-be-accessed storage area. For example, one bit may be used for differentiation: "0" indicates that the last historical access type is a write operation, and "1" indicates that the type of a last historical access operation is a read operation.

Optionally, the historical access information may record last N historical access types to the to-be-accessed storage area, where N is a positive integer greater than 1.

For example, when N is 2, two bits may be used for differentiation: "00" indicates that last two historical access types are both write operations; "01" indicates that last two historical access types are sequentially a write operation and a read operation; "10" indicates that last two historical access types are sequentially a read operation and a write operation; "11" indicates that last two historical access types are both read operations. When N is another positive integer, similarly, N bits may be used for differentiation.

It should be understood that "0" is used to indicate a write operation and "1" is used to indicate a read operation in the example in this embodiment of the present invention. In an actual operation, another indication method may be used to record the historical access type. This is not limited in this embodiment of the present invention.

In a specific implementation process, the historical access information records a correspondence between address information and the historical access type of the to-be-accessed storage area. The historical access information may be recorded in an address mapping table that is about a mapping from a logical address to a physical address. In this way, excessive consumption of space for recording the address information of the to-be-accessed storage area can be avoided. Certainly, the historical access information may also be separately recorded. A form of the historical access information is not limited in this embodiment of the present invention.

Specifically, the storage controller maintains a historical access information table. The historical access information table includes historical access information entries corresponding to multiple pieces of valid address information, and correspondences between address information and historical access types of storage areas are stored in the historical access information entries.

In a specific implementation process, the historical access information may be recorded based on a granularity of a flash memory page, or another algorithm may be used to record the historical access information based on a smaller granularity. This is not limited in this embodiment of the present invention.

Figure 7:
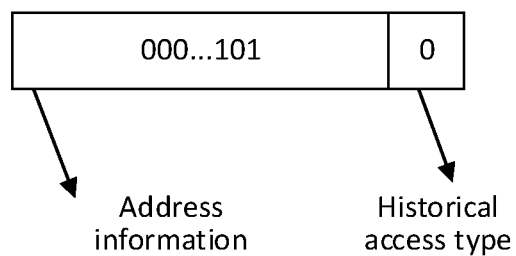
FIG. 7 is a schematic diagram of a historical access information entry according to an embodiment of the present invention.

FIG. 7 is a schematic diagram of a historical access information entry according to an embodiment of the present invention. The historical access information entry records the address information and the historical access type of the to-be-accessed storage area.

S608. The storage controller records the historical access information of the to-be-accessed storage area.

If the storage controller does not find the historical access information of the to-be-accessed storage area in the historical access record, or more specifically, if the storage controller does not find, in the historical access information table, a historical access information entry corresponding to the address information, it indicates that the operating system writes the to-be-accessed storage area for the first time. In this case, the storage controller writes to-be-written data to the to-be-accessed storage area, and records the historical access information of the to-be-accessed storage area in the historical access record. More specifically, the storage controller creates a historical access information entry in the historical access information table, and sets the historical access type of the to-be-accessed storage area to a write operation.

It should be understood that the first-time write herein refers to a first-time write access request for the to-be-accessed storage area, and is a first-time write for the to-be-accessed storage area from a "data invalid" state to a "data valid" state. During the first-time write, the historical access information entry corresponding to the to-be-accessed storage area is created, and the historical access type of the to-be-accessed storage area is recorded as a write operation.

Optionally, during the first-time write, the storage controller writes the to-be-written data to the to-be-accessed storage area in a form of the slow write, where the form of the write operation includes the slow write and the fast write. The data is written for the first time, and a characteristic of a subsequent access to the data is unknown during the write. That is, whether the data has a read-only characteristic, a write-only characteristic, or a cross-access characteristic is unknown. Therefore, during the first-time write, regardless of a characteristic of the to-be-written data, the form of the slow write may be used to write the to-be-written data.

The form of the write operation may further include a normal write. A form of the normal write or the fast write may also be used during the first-time write, but the data may have the read-only characteristic, and in this case, subsequently, a read operation on the data is adversely affected. A form of the first-time write of the data is not limited in this embodiment of the present invention.

S610. The storage controller determines whether the historical access type of the to-be-accessed storage area is a write operation; and if the historical access type of the to-be-accessed storage area is a write operation, the storage controller performs step S612, or if the historical access type of the to-be-accessed storage area is not a write operation, the storage controller performs step S614.

Specifically, the storage controller determines whether the historical access type recorded in the historical access information entry corresponding to the to-be-accessed storage area is a write operation. That the historical access type is a write operation means that all historical access types are write operations. If the historical access type of the to-be-accessed storage area is a write operation, because the access type of the current access request is also a write operation, it indicates that data in the to-be-accessed storage area has a write-only characteristic. If not all the historical access types are write operations, the historical access type is not a write operation, and because the access type of the current access request is a write operation, it indicates that the data stored in the to-be-accessed storage area has a cross-access characteristic.

S612. The storage controller writes to-be-written data to the to-be-accessed storage area in a form of the fast write.

Because the historical access type of the to-be-accessed storage area is a write operation, and the type of the current access request is a write operation, it indicates that the data in the to-be-accessed storage area has a write-only characteristic, and a read operation is scarcely performed on the data in the to-be-accessed storage area. To avoid consumption caused by a write operation, the to-be-written data is written in the form of the fast write.

Because the historical access type is a write operation, and the access type of the current access request is also a write operation, the current access request does not change the historical access type, and the historical access information may not be updated, so that the historical access type in the historical access information entry keeps unchanged.

In a specific implementation process, because the original data cannot be overwritten in the flash memory, before the write operation on the to-be-accessed storage area indicated by the address information, the storage controller first modifies the address mapping table that is about a mapping from a logical address to a physical address, redirects the logical address to a new physical address, and then writes the to-be-written data at the new physical address. The storage controller sets the data at an original physical address to an "invalid" state. Subsequently, a garbage collection mechanism needs to erase the data at the original physical address before a write operation can be performed at the original physical address.

S614. The storage controller performs a write operation on the to-be-accessed storage area in a form of a normal write, and updates the historical access information of the to-be-accessed storage area.

Because the historical access type is not a write operation, it indicates that the to-be-accessed storage area indicated by the address information has a cross-access characteristic. In this case, a write operation is performed on the to-be-accessed storage area in the form of the normal write, so as to achieve a balance between read costs and write costs.

Optionally, in step S614, the storage controller may also perform a write operation on the to-be-accessed storage area in a form of the slow write or the fast write. However, relatively high write costs are required to use the slow write, and relatively high read costs are required to use the fast write.

Because the historical access type is not a write operation, and the access type of the current access request is a write operation, the historical access type needs to be updated. If only one bit is used to record a last historical access type, the historical access type only needs to be updated to a write operation. If last N historical access types are recorded, according to an actual situation, the historical access type may be updated in a "shifting" manner. For example, when N is 2, and a mark of the historical access type is "11", it indicates that last two historical access types are both read operations ("0" is used to indicate a write operation, and "1" is used to indicate a read operation). Because the current operation is indicated by "0", "11" only needs to be modified as "10".

S616. The storage controller performs a read operation on the to-be-accessed storage area.

First, a read operation is performed on the to-be-accessed storage area in a manner of the fast read. For example, hard decision may be used, or soft decision having a relatively small quantity of threshold voltages between adjacent states is used. If decoding succeeds, the read operation ends. If decoding fails, a speed of the read operation is reduced to increase accuracy of the read operation; reading is performed again, and decoding is performed. For example, hard decision may be changed to soft decision, or the quantity of threshold voltages between adjacent states of soft decision may be increased.

Specifically, the storage controller may use an LDPC code as a check code, and LDPC hard decision decoding may be used for the read operation first. If check succeeds, the read operation succeeds. On the contrary, if check fails, decoding fails, and a soft decision is used for decoding. If decoding still fails, a quantity of threshold voltages between adjacent states of the soft decision is gradually increased, until information is correctly decoded.

It should be understood that the foregoing description in this embodiment of the present invention is merely an example for description. The form of the read operation and used ECC encoding are not limited in this embodiment of the present invention.

S618. The storage controller determines whether a historical access type of the to-be-accessed storage area is a read operation; and if the historical access type of the to-be-accessed storage area is a read operation, the storage controller performs step S622, or if the historical access type of the to-be-accessed storage area is not a read operation, the storage controller performs step S620.

Specifically, the storage controller determines whether the historical access type recorded in a historical access information entry corresponding to the to-be-accessed storage area is a read operation. That the historical access type is a read operation means that all historical access types are read operations. If the historical access type is a read operation, because the type of the current access request is also a read operation, it indicates that the to-be-accessed storage area indicated by the address information has a read-only characteristic. If all the historical access types are not read operations, the historical access type is not a read operation, and it indicates that the to-be-accessed storage area indicated by the address information has a cross-access characteristic.

S620. The storage controller updates the historical access information.

Because the historical access type is not a read operation, and the access type of the current access request is a read operation, the historical access type needs to be updated. If only one bit is used to record a last historical access type, the historical access type only needs to be updated to a read operation. If last N historical access types are recorded, according to an actual situation, the historical access type may be updated in a "shifting" manner. For example, when N is 2, and a mark of the historical access type is "00", it indicates that last two historical access types are both write operations ("0" is used to indicate a write operation, and "1" is used to indicate a read operation). Because the current operation is indicated by "1", "00" only needs to be modified as "01".

S622. The storage controller determines whether decoding fails in a read operation process in which the fast read is used; and if decoding fails, the storage controller performs step S624, or if decoding succeeds, the procedure ends.

Because the historical access type of the to-be-accessed storage area is a read operation, and the type of the current access request is a read operation, it indicates that the to-be-accessed storage area indicated by the address information has a read-only characteristic, and accesses to the to-be-accessed storage area are mostly read operations. When reading by the storage controller in a form of the fast read fails, it indicates that data stored in the to-be-accessed storage area has low accuracy.

S624. The storage controller performs a rewrite operation on the to-be-accessed storage area in a form of the slow write.

If the data in the to-be-accessed storage area has a read-only characteristic, and it is detected that decoding using the fast read for the to-be-accessed storage area fails, the storage controller performs a rewrite operation on the to-be-accessed storage area in the form of the slow write, so as to improve a speed of a subsequent read operation on the to-be-accessed storage area. That is, when decoding using the fast read fails and the historical access type is a read operation, the data stored in the to-be-accessed storage area is rewritten to the to-be-accessed storage area in the form of the slow write.

Because the original data cannot be directly overwritten in a flash memory page of the flash memory, old data needs to be erased before new data can be written. The rewrite operation herein refers to a rewrite at the logical address. The storage controller modifies an address mapping relationship from the logical address to a physical address, so that the logical address points to a new available physical address, and writes the data at the new physical address. The original physical address is marked as "invalid", and can be reused only after the data at the original physical address is subsequently erased.

Optionally, in another possible implementation of this embodiment of the present invention, if the data in the to-be-accessed storage area has a read-only characteristic, when a bit error rate of decoding during the read operation exceeds a preset threshold, the data stored in the to-be-accessed storage area is rewritten to the to-be-accessed storage area in the form of the slow write.

To avoid blocking of a normal access operation on the flash memory, the storage controller may save the address information of the to-be-accessed storage area in a rewrite queue. When the flash memory is idle, the storage controller may read the data from the to-be-accessed storage area according to the address information included in the rewrite queue, and rewrite the read data to the to-be-accessed storage area in the form of the slow write.

Specifically, address information that needs to be rewritten may be organized into an LRU (Least Recently Used) linked list, and the LRU linked list may be stored in a cache. When the storage controller detects that a system is idle, the storage controller reads the LRU linked list from the cache, obtains address information from the LRU linked list, reads, from the corresponding address information, data that needs to be rewritten, adjusts a step voltage for a write operation, rewrites the to-be-rewritten data to the flash memory in the form of the slow write, and deletes the logical address from the rewrite queue.

Data at the head of the LRU linked list, that is, data that is most recently added to the linked list or data accessed for the last time, may be preferentially rewritten. When data recorded in the linked list has been updated by a write access of a host before a rewrite, address information of the data may be directly deleted from the linked list without performing a rewrite.

Optionally, after the read operation succeeds, the storage controller may also directly perform a rewrite operation on the to-be-accessed storage area according to the data successfully read. This avoids multiple reads of the data, but may block a normal access operation on the flash memory.

When determining that the data in the to-be-accessed storage area is invalid, the storage controller deletes the historical access information corresponding to the to-be-accessed storage area. For example, the storage controller may receive a deletion notification message from the operating system, where the deletion notification message is used to indicate that the data in the to-be-accessed storage area already is invalid. In this case, the storage controller deletes the historical access information entry of the to-be-accessed storage area, and the to-be-accessed storage area changes from a valid state to an invalid state.

Specifically, if the flash memory device supports a trim function, the storage controller may further receive a trim instruction. The trim instruction carries address information to indicate that data at the address information is deleted by the operating system. In this case, the storage controller may delete a historical access information entry corresponding to the address information from the historical access information table, and mark data at a physical block address corresponding to the address information as "invalid" to wait for a subsequent erasure operation.

Optionally, the historical access information further includes a write speed mark used to record a speed of a write operation in detail. In this case, the storage controller may further establish a correspondence between the speed of the write operation and a speed of a read operation. Therefore, in a cross-access scenario, the storage controller performs a read operation on the to-be-accessed storage area according to the write speed mark. The fast write corresponds to the slow read, and the slow write corresponds to the fast read.

It should be understood that the method 600 is merely an example for describing the method for accessing a flash memory device. The specific steps may not be performed in a specific order or may be combined. The sequence numbers of the steps in the present invention are merely for describing the procedure of the solution more clearly, and do not limit an order in which the steps are performed.

According to the technical solution disclosed in this embodiment of the present invention, based on an access characteristic of data, data is classified into three types: read-only data, write-only data, and cross-access data, and the three types of data are distinguished from one another by using a historical access type. Therefore, a speed for data having a read-only characteristic is regulated, and a slow write is performed to achieve a fast read, so that read performance is greatly improved while write performance is almost not affected. A speed for data having a write-only characteristic is regulated, and a fast write is performed, so that write performance is greatly improved while read performance is almost not affected. Further, a speed for data having a cross-access characteristic may also be regulated, and a normal write is performed, thereby achieving a balance between read and write speeds.

Figure 8:
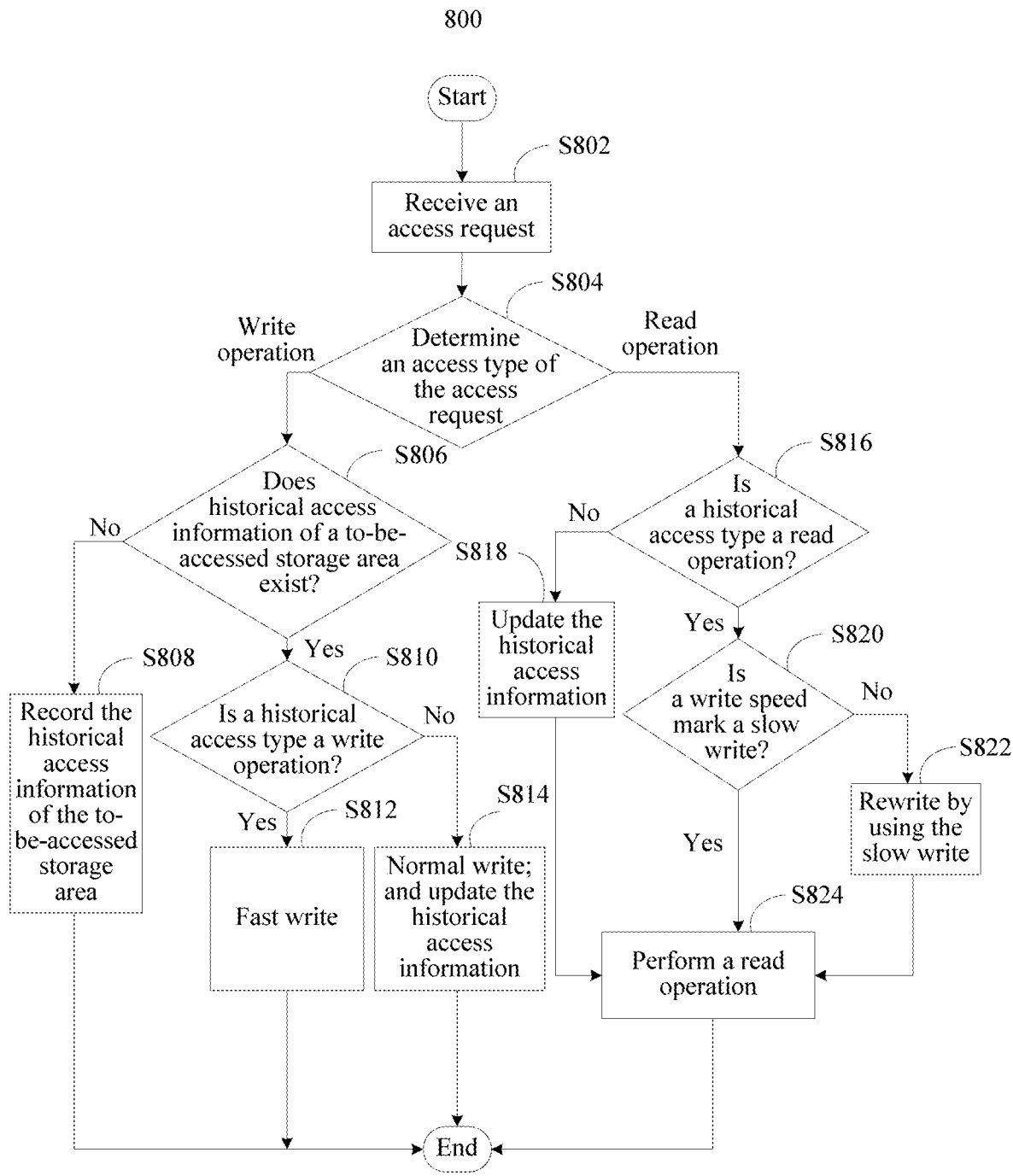
FIG. 8 is an example of a flowchart of a method for accessing a flash memory device according to an embodiment of the present invention.

FIG. 8 is a flowchart of a method 800 for accessing a flash memory device according to an embodiment of the present invention. Historical access information further includes a write speed mark. The write speed mark is used to record a form of a write operation, so as to indicate whether data stored in a to-be-accessed storage area is written in a form of a slow write.

Specifically, a storage controller may record, by using a write speed mark of one bit, whether the data is written in the form of the slow write. For example, "0" indicates that the data is written in the form of the slow write, and "1" indicates that the data is not written in the form of the slow write.

Further, the storage controller may also record a speed of the write operation in detail. If the speed of the write operation is classified into M levels, a write speed mark of cell($Log_2$ M) bits in total is needed to record the speed of the write operation. For example, if the speed of the write operation is classified into three levels: the slow write, a normal write, and a fast write, cell($Log_2$ 3)=2 bits are needed to record the speed of the write operation. For example, "00" may be used to indicate the slow write, "01" may be used to indicate the normal write, "10" is used to indicate the fast write, and a state "11" is used as reserved bits.

Figure 9:
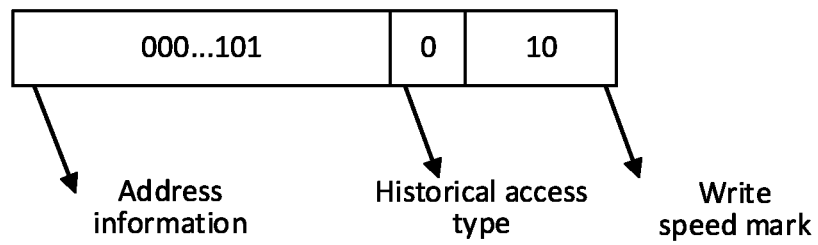
FIG. 9 is a schematic diagram of a historical access information entry according to an embodiment of the present invention.

FIG. 9 is a schematic diagram of a historical access information entry according to an embodiment of the present invention. The historical access information entry records the historical access information corresponding to the to-be-accessed storage area.

As shown in FIG. 8, the method 800 includes the following steps.

For feature descriptions of S802 to S814, refer to steps S602 to S614. Further, when performing a write operation, the storage controller further records whether the form of the write operation is the slow write, or records in detail a speed level of the write operation. For the remaining part, refer to S602 to S614, and details are not described herein again.

S816. The storage controller determines whether a historical access type of the to-be-accessed storage area is a read operation; and if the historical access type of the to-be-accessed storage area is a read operation, the storage controller performs step S820, or if the historical access type of the to-be-accessed storage area is not a read operation, the storage controller performs step S818.

For a specific description, refer to step S618, and details are not described herein again.

S818. The storage controller updates the historical access type.

For a specific description, refer to step S620, and details are not described herein again.

S820. The storage controller determines whether the form of the write operation is the slow write; and if the form of the write operation is the slow write, the storage controller performs step S824, or if the form of the write operation is not the slow write, the storage controller performs step S822.

Specifically, because the historical access type is a read operation, and an access type of a current access request is also a read operation, it indicates that the to-be-accessed storage area indicated by the address information has a read-only characteristic. To reduce costs of the read operation, the storage controller determines whether a speed mark in a historical access information entry corresponding to the address information is the slow write. If the speed mark indicates the slow write, the storage controller directly performs a read operation. If the speed mark does not indicate the slow write, it indicates that it cannot be ensured that data can be quickly read, and the storage controller needs to perform a slow rewrite operation on the to-be-accessed storage area.

S822. The storage controller performs a rewrite operation on the to-be-accessed storage area in the form of the slow write.

If the data in the to-be-accessed storage area has a read-only characteristic, and the data stored in the to-be-accessed storage area is not written in the form of the slow write, it indicates that the data stored in the to-be-accessed storage area has relatively low write accuracy. In this case, the storage controller needs to perform a rewrite operation on the to-be-accessed storage area in the form of the slow write, so as to improve a speed of a subsequent read operation on the to-be-accessed storage area. That is, when the historical access type of the to-be-accessed storage area is a read operation, and the write speed mark does not indicate the slow write, the data stored in the to-be-accessed storage area is rewritten to the to-be-accessed storage area in the form of the slow write.

For a specific description, refer to step S624, and details are not described herein again.

After rewriting the data stored in the to-be-accessed storage area to the to-be-accessed storage area in the form of the slow write, the storage controller updates the write speed mark to the slow write.

S824. The storage controller performs a read operation on the to-be-accessed storage area indicated by the address information.

For a specific description of step S824, refer to step S616, and details are not described herein again.

If the storage controller uses the write speed mark to record a speed of a write operation in detail, the storage controller may further establish a correspondence between the speed of the write operation and a speed of a read operation, and perform a read operation on the to-be-accessed storage area according to the write speed mark. A fast write corresponds to a slow read, and the slow write corresponds to a fast read.

Further, the write operation may be classified into three levels: the slow write, the normal write, and the fast write, and the read operation may be correspondingly classified into three levels: the fast read, a normal read, and the slow read. The slow write corresponds to the fast read, the normal write corresponds to the normal read, and the fast write corresponds to the slow read.

When performing a read operation on the to-be-accessed storage area indicated by the address information, the storage controller may directly select, according to the form of the write operation recorded in the historical access information, a corresponding form of the read operation for reading.

When determining that the data in the to-be-accessed storage area is invalid, the storage controller deletes the historical access information corresponding to the to-be-accessed storage area. For a specific description, refer to the description in the embodiment in FIG. 6, and details are not described herein again.

It should be understood that the method 800 is merely an example for describing the method for a flash memory device. The specific steps may not be performed in a specific order or may be combined. The sequence numbers of the steps in the present invention are merely for describing the procedure of the solution more clearly, and do not limit an order in which the steps are performed.

According to the technical solution disclosed in this embodiment of the present invention, based on an access characteristic of data, data is classified into three types: read-only data, write-only data, and cross-access data, and the three types of data are distinguished from one another by using a historical access type. Therefore, a speed for data having a read-only characteristic is regulated, and a slow write is performed to achieve a fast read, so that read performance is greatly improved while write performance is almost not affected. A speed for data having a write-only characteristic is regulated, and a fast write is performed, so that write performance is greatly improved while read performance is almost not affected. Further, a speed for data having a cross-access characteristic may also be regulated, and a normal write is performed, thereby achieving a balance between read and write speeds.

Figure 10:
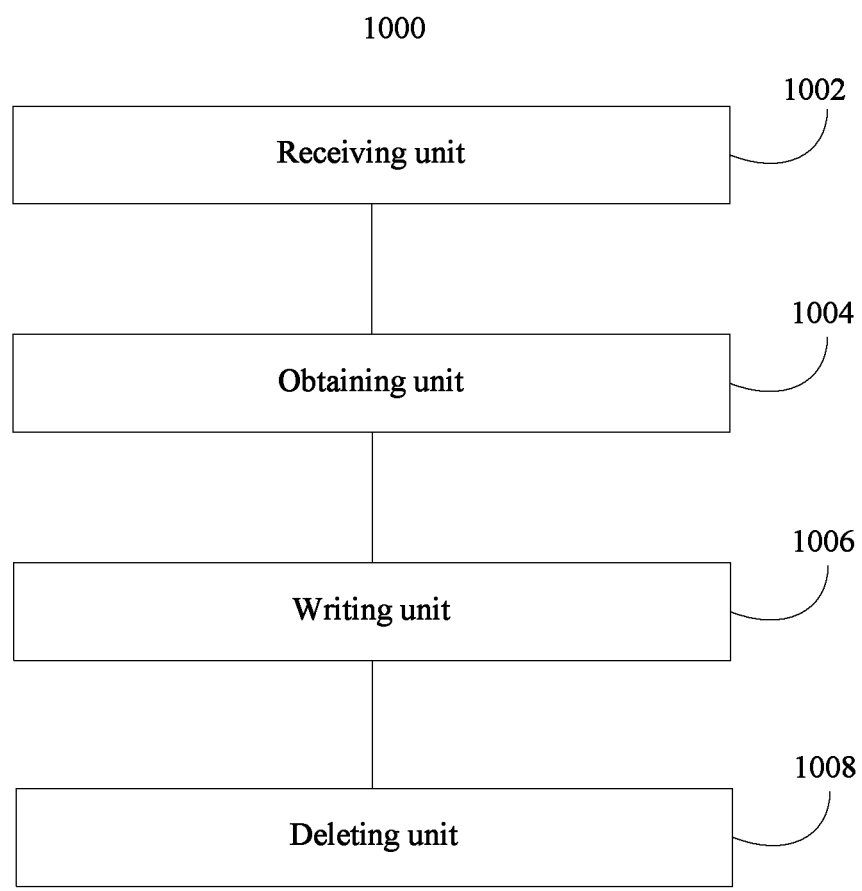
FIG. 10 is a schematic diagram of a logical structure of an apparatus for accessing a flash memory device according to an embodiment of the present invention.

FIG. 10 is a schematic diagram of a logical structure of an apparatus 1000 for accessing a flash memory device according to an embodiment of the present invention. As shown in FIG. 10, the apparatus 1000 includes a receiving unit 1002, an obtaining unit 1004, and a writing unit 1006.

The receiving unit 1002 is configured to receive a first write access request for a to-be-accessed storage area.

In a specific implementation process, the receiving unit 1002 may be implemented by using the processor 202, the memory 204, and the communications interface 208 shown in FIG. 2. More specifically, the processor 202 may execute a communications module in the memory 204, so that the communications interface 208 receives the first write access request from an operating system.

The obtaining unit 1004 is configured to obtain a historical access type of the to-be-accessed storage area, where the historical access type is an access type of access to the to-be-accessed storage area before the first write access request, and a type of access to a flash memory device includes a write operation and a read operation.

In a specific implementation process, the obtaining unit 1004 may be implemented by using the processor 202 and the memory 204 shown in FIG. 2. More specifically, the processor 202 may execute the access control module in the memory 204, so as to obtain the historical access type of the to-be-accessed storage area according to address information of the to-be-accessed storage area.

The writing unit 1006 is configured to: when the historical access type of the to-be-accessed storage area is a write operation, write to-be-written data of the first write access request to the to-be-accessed storage area in a form of a fast write, where a form of the write operation on the flash memory device includes the fast write and a slow write, and a write speed of the fast write is greater than a write speed of the slow write.

In a specific implementation process, the writing unit 1006 may be implemented by using the processor 202 and the memory 204 shown in FIG. 2. More specifically, the processor 202 may execute the access control module in the memory 204, so as to write the to-be-written data of the first write access request to the to-be-accessed storage area in the form of the fast write.

That the obtaining unit 1004 is configured to obtain a historical access type of the to-be-accessed storage area includes: the obtaining unit 1004 is configured to search for the historical access type that is of the to-be-accessed storage area and that is recorded in a historical access record.

Before receiving the first write access request for the to-be-accessed storage area, the receiving unit 1002 is further configured to receive a second write access request for the to-be-accessed storage area, where the second write access request is a first-time write access request for the to-be-accessed storage area; and the writing unit 1006 is further configured to: write to-be-written data of the second write access request to the to-be-accessed storage area, and record the historical access type of the to-be-accessed storage area in the historical access record.

That the writing unit 1006 is configured to write to-be-written data of the second write access request to the to-be-accessed storage area includes: the writing unit 1006 is configured to write the to-be-written data of the second write access request to the to-be-accessed storage area in a form of the slow write.

The apparatus 1000 further includes a deleting unit 1008. When it is determined that the data in the to-be-accessed storage area is invalid, the deleting unit 1008 is configured to delete the recorded historical access type of the to-be-accessed storage area.

In a specific implementation process, the deleting unit 1008 may be implemented by using the processor 202 and the memory 204 shown in FIG. 2. More specifically, the processor 202 may execute the access control module in the memory 204, so as to delete the recorded historical access type of the to-be-accessed storage area according to a deletion notification message received by the receiving unit 1002 from the operating system.

Optionally, the writing unit 1006 is further configured to: when the historical access type of the to-be-accessed storage area is not a write operation, write the to-be-written data of the first write access request to the to-be-accessed storage area in the form of the slow write, and update the historical access type of the to-be-accessed storage area.

Optionally, the form of the write operation further includes a normal write, and a write speed of the normal write is greater than the write speed of the slow write and is less than the write speed of the fast write. The writing unit 1006 is further configured to: when the historical access type of the to-be-accessed storage area is not a write operation, write the to-be-written data of the first write access request to the to-be-accessed storage area in a form of the normal write, and update the historical access type of the to-be-accessed storage area.

It should be understood that, for ease of description, the functions of the obtaining unit 1004, the writing unit 1006, and the deleting unit 1008 in this embodiment of the present invention may be integrated in the access control module shown in FIG. 2. The processor 202 executes different parts of the access control module to implement different functions. However, in a specific implementation, the access control module may be further specified. This is not limited in this embodiment of the present invention.

This embodiment of the present invention is an apparatus embodiment of the storage controller 112. The feature descriptions in the embodiments in FIG. 6 and FIG. 8 are applicable to this embodiment of the present invention. Details are not described herein again.

Figure 11:
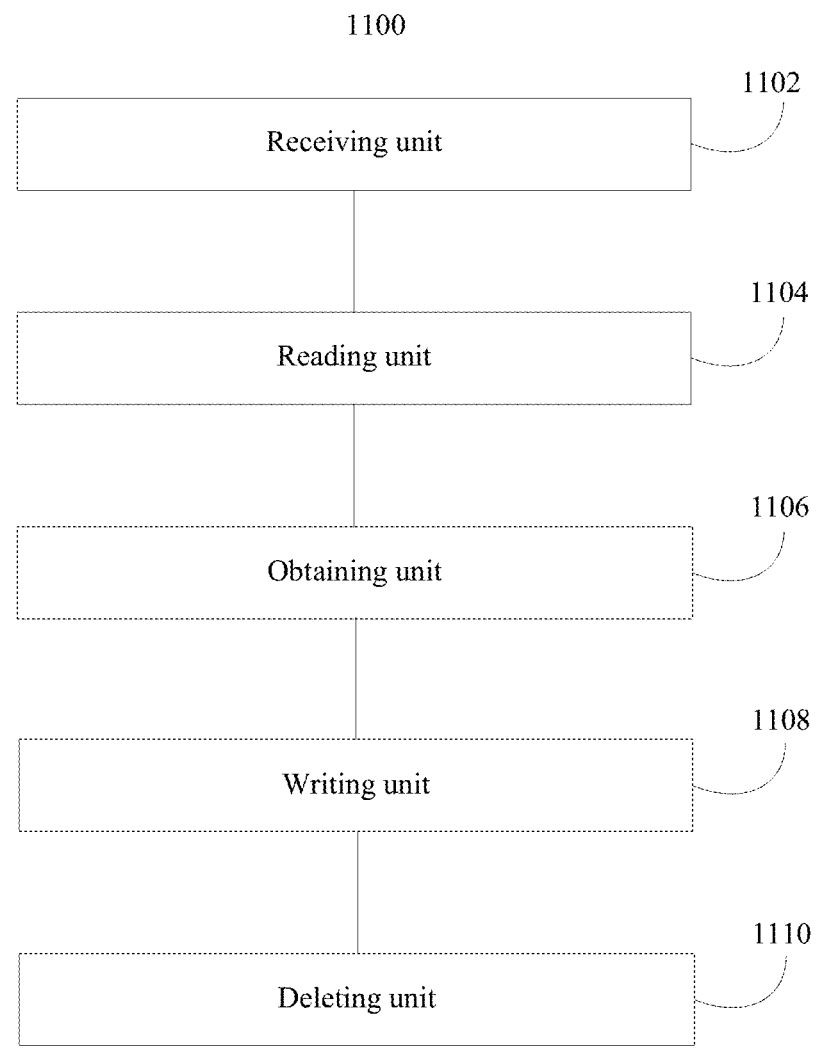
FIG. 11 is a schematic diagram of a logical structure of an apparatus for accessing a flash memory device according to an embodiment of the present invention.

FIG. 11 is a schematic diagram of a logical structure of an apparatus 1100 for accessing a flash memory device according to an embodiment of the present invention. As shown in FIG. 11, the apparatus 1100 includes a receiving unit 1102, a reading unit 1104, an obtaining unit 1106, and a writing unit 1108.

The receiving unit 1102 is configured to receive a read access request for a to-be-accessed storage area.

In a specific implementation process, the receiving unit 1102 may be implemented by using the processor 202, the memory 204, and the communications interface 208 shown in FIG. 2. More specifically, the processor 202 may execute a communications module in the processor 204, so that the communications interface 208 receives the read access request from an operating system.

The reading unit 1104 is configured to perform a read operation on the to-be-accessed storage area in a form of a fast read, where a form of the read operation on a flash memory device includes the fast read and a slow read, and a read speed of the fast read is greater than a read speed of the slow read.

In a specific implementation process, the reading unit 1104 may be implemented by using the processor 202 and the memory 204 shown in FIG. 2. More specifically, the processor 202 may execute the access control module in the memory 204, so as to perform a read operation on the to-be-accessed storage area.

The obtaining unit 1106 is configured to obtain a historical access type of the to-be-accessed storage area, where the historical access type is an access type of access to the to-be-accessed storage area before the read access request, and a type of access to the flash memory device includes a write operation and a read operation.

In a specific implementation process, the obtaining unit 1106 may be implemented by using the processor 202 and the memory 204 shown in FIG. 2. More specifically, the processor 202 may execute the access control module in the memory 204, so as to obtain the historical access type of the to-be-accessed storage area according to address information of the to-be-accessed storage area.

The writing unit 1108 is configured to: when decoding using the fast read fails and the historical access type is a read operation, rewrite data stored in the to-be-accessed storage area to the to-be-accessed storage area in a form of the slow write, where a form of the write operation on the flash memory device includes a fast write and a slow write, and a write speed of the fast write is greater than a write speed of the slow write.

In a specific implementation process, the writing unit 1108 may be implemented by using the processor 202 and the memory 204 shown in FIG. 2. More specifically, the processor 202 may execute the access control module in the memory 204, so as to rewrite data stored in the to-be-accessed storage area to the to-be-accessed storage area in the form of the slow write.

That the obtaining unit 1106 is configured to obtain a historical access type of the to-be-accessed storage area includes: the obtaining unit 1106 is configured to search for the historical access type that is of the to-be-accessed storage area and that is recorded in a historical access record.

Before receiving the read access request for the to-be-accessed storage area, the receiving unit 1102 is further configured to receive a second write access request for the to-be-accessed storage area, where the second write access request is a first-time write access request for the to-be-accessed storage area; and the writing unit 1108 is further configured to: write to-be-written data of the second write access request to the to-be-accessed storage area, and record the historical access type of the to-be-accessed storage area in the historical access record.

That the writing unit 1108 is configured to write to-be-written data of the second write access request to the to-be-accessed storage area includes: the writing unit 1108 is configured to write the to-be-written data of the second write access request to the to-be-accessed storage area in the form of the slow write.

The apparatus 1100 further includes a deleting unit 1110. When it is determined that the data in the to-be-accessed storage area is invalid, the deleting unit 1110 is configured to delete the recorded historical access type of the to-be-accessed storage area.

In a specific implementation process, the deleting unit 1110 may be implemented by using the processor 202 and the memory 204 shown in FIG. 2. More specifically, the processor 202 may execute the access control module in the memory 204, so as to delete the recorded historical access type of the to-be-accessed storage area according to a deletion notification message received by the receiving unit 1102 from the operating system.

Optionally, the reading unit 1104 is further configured to: when decoding using the fast read fails, perform a read operation on the to-be-accessed storage area in a form of the slow read.

Optionally, the form of the read operation further includes a normal read, and a read speed of the normal read is greater than the read speed of the slow read and is less than the read speed of the fast read. The reading unit 1104 is further configured to: when decoding using the fast read fails, perform a read operation on the to-be-accessed storage area in a form of the normal read.

The writing unit 1108 is further configured to: when the historical access type is not a read operation, update the historical access type.

Optionally, before rewriting the data stored in the to-be-accessed storage area to the to-be-accessed storage area in the form of the slow write, the writing unit 1108 is further configured to save address information of the to-be-accessed storage area in a rewrite queue; and the reading unit 1104 is further configured to read, from the to-be-accessed storage area according to the address information saved in the rewrite queue, the data stored in the to-be-accessed storage area.

It should be understood that, for ease of description, the functions of the reading unit 1104, the obtaining unit 1106, the writing unit 1108, and the deleting unit 1110 in this embodiment of the present invention may be integrated in the access control module shown in FIG. 2. The processor 202 executes different parts of the access control module to implement different functions. However, in a specific implementation, the access control module may be further specified. This is not limited in this embodiment of the present invention.

An apparatus embodiment of the storage controller 112 is provided in this embodiment of the present invention. The feature descriptions in the embodiments in FIG. 6 and FIG. 8 are applicable to this embodiment of the present invention. Details are not described herein again.

Figure 12:
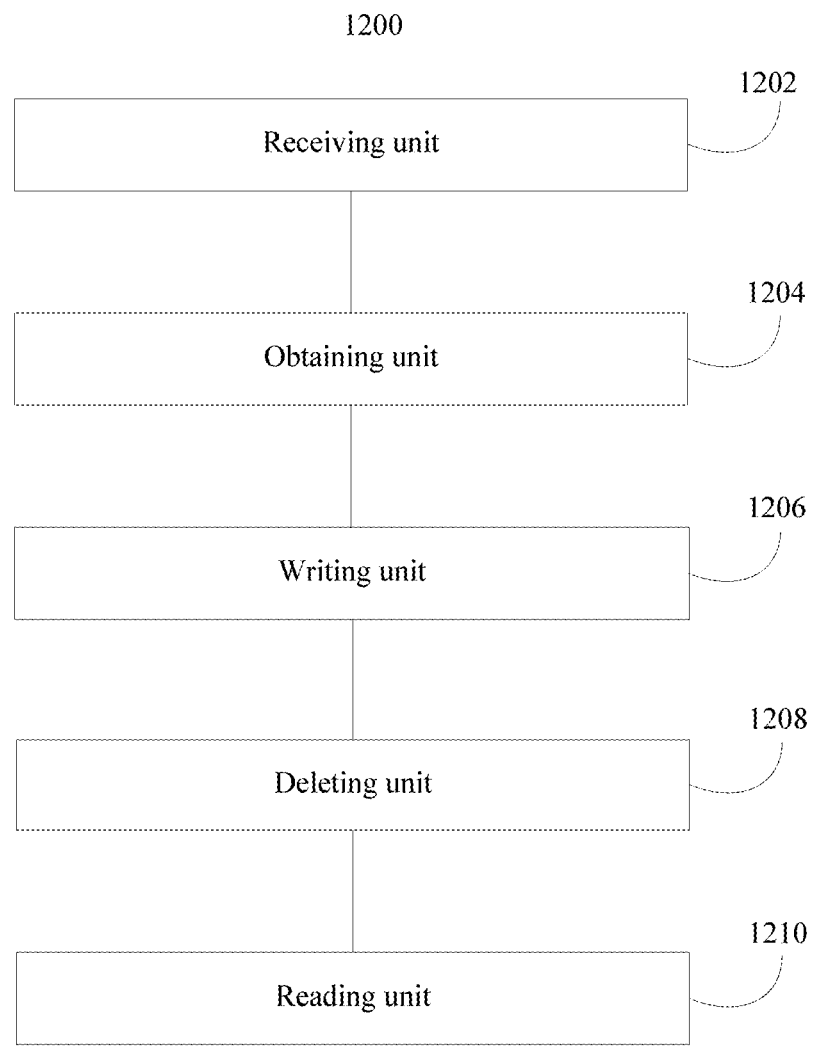
FIG. 12 is a schematic diagram of a logical structure of an apparatus for accessing a flash memory device according to an embodiment of the present invention.

FIG. 12 is a schematic diagram of a logical structure of an apparatus 1200 for accessing a flash memory device according to an embodiment of the present invention. As shown in FIG. 12, the apparatus 1200 includes a receiving unit 1202, an obtaining unit 1204, and a writing unit 1206.

The receiving unit 1202 is configured to receive a read access request for a to-be-accessed storage area.

In a specific implementation process, the receiving unit 1202 may be implemented by using the processor 202, the memory 204, and the communications interface 208 shown in FIG. 2. More specifically, the processor 202 may execute a communications module in the processor 204, so that the communications interface 208 receives the read access request from an operating system.

The obtaining unit 1204 is configured to obtain historical access information of the to-be-accessed storage area, where the historical access information includes a historical access type and a write speed mark of the to-be-accessed storage area, the write speed mark is used to indicate a form of a write operation on data stored in the to-be-accessed storage area, and the historical access type is an access type of access to the to-be-accessed storage area before the read access request. A type of access to a flash memory device includes a write operation and a read operation. A form of a write operation on the flash memory device includes a fast write and a slow write, and a write speed of the fast write is greater than a write speed of the slow write.

In a specific implementation process, the obtaining unit 1204 may be implemented by using the processor 202 and the memory 204 shown in FIG. 2. More specifically, the processor 202 may execute the access control module in the memory 204, so as to obtain the historical access information of the to-be-accessed storage area according to address information of the to-be-accessed storage area.

The writing unit 1206 is configured to: when the historical access type is a read operation and the write speed mark does not indicate the slow write, rewrite the data stored in the to-be-accessed storage area to the to-be-accessed storage area in a form of the slow write.

In a specific implementation process, the writing unit 1206 may be implemented by using the processor 202 and the memory 204 shown in FIG. 2. More specifically, the processor 202 may execute the access control module in the memory 204, so as to rewrite the data stored in the to-be-accessed storage area to the to-be-accessed storage area in the form of the slow write.

That the obtaining unit 1204 is configured to obtain historical access information of the to-be-accessed storage area includes: the obtaining unit 1204 is configured to search for the historical access information that is of the to-be-accessed storage area and that is recorded in a historical access record.

Before receiving the read access request for the to-be-accessed storage area, the receiving unit 1202 is further configured to receive a second write access request for the to-be-accessed storage area, where the second write access request is a first-time write access request for the to-be-accessed storage area; and the writing unit 1206 is further configured to: write to-be-written data of the second write access request to the to-be-accessed storage area, and record the historical access information of the to-be-accessed storage area in the historical access record.

That the writing unit 1206 is configured to write to-be-written data of the second write access request to the to-be-accessed storage area includes: the writing unit 1206 is configured to write the to-be-written data of the second write access request to the to-be-accessed storage area in the form of the slow write.

The apparatus 1200 further includes a deleting unit 1208. When it is determined that the data in the to-be-accessed storage area is invalid, the deleting unit 1208 is configured to delete the recorded historical access information of the to-be-accessed storage area.

In a specific implementation process, the deleting unit 1208 may be implemented by using the processor 202 and the memory 204 shown in FIG. 2. More specifically, the processor 202 may execute the access control module in the memory 204, so as to delete the recorded historical access information of the to-be-accessed storage area according to a deletion notification message received by the receiving unit 1202 from the operating system.

After rewriting the data stored in the to-be-accessed storage area to the to-be-accessed storage area in the form of the slow write, the writing unit 1206 is further configured to update the write speed mark to the slow write.

The apparatus 1200 further includes a reading unit 1210. The read operation includes a fast read and a slow read. After the obtaining unit 1204 obtains historical access information of the to-be-accessed storage area, the reading unit 1210 is configured to perform a read operation on the to-be-accessed storage area according to the write speed mark, where the fast write corresponds to the slow read, and the slow write corresponds to the fast read.

In a specific implementation process, the reading unit 1210 may be implemented by using the processor 202 and the memory 204 shown in FIG. 2. More specifically, the processor 202 may execute the access control module in the memory 204, so as to perform a read operation on the to-be-accessed storage area according to the write speed mark.

Optionally, before rewriting the data stored in the to-be-accessed storage area to the to-be-accessed storage area in the form of the slow write, the writing unit 1206 is further configured to save address information of the to-be-accessed storage area in a rewrite queue; and the reading unit 1210 is configured to read, from the to-be-accessed storage area according to the address information saved in the rewrite queue, the data stored in the to-be-accessed storage area.

It should be understood that, for ease of description, the functions of the obtaining unit 1204, the writing unit 1206, and the deleting unit 1208, and the reading unit 1210 in this embodiment of the present invention may be integrated in the access control module shown in FIG. 2. The processor 202 executes different parts of the access control module to implement different functions. However, in a specific implementation, the access control module may be further specified. This is not limited in this embodiment of the present invention.

An apparatus embodiment of the storage controller 112 is provided in this embodiment of the present invention. The feature descriptions in the embodiments in FIG. 6 and FIG. 8 are applicable to this embodiment of the present invention. Details are not described herein again.

In the embodiments provided in the present application, it should be understood that the disclosed system, device, and method may be implemented in other manners. For example, the described apparatus embodiment is merely an example. For example, the module division is merely logical function division and may be other division in actual implementation. For example, a plurality of modules or components may be combined or integrated into another system, or some features may be ignored or not performed. In addition, the displayed or discussed mutual couplings or direct couplings or communication connections may be implemented through some interfaces. The indirect couplings or communication connections between the apparatuses or modules may be implemented in electronic, mechanical, or other forms.

The modules described as separate parts may or may not be physically separate, and parts displayed as modules may or may not be physical modules, may be located in one position, or may be distributed on a plurality of network modules. Some or all the modules may be selected according to actual needs to achieve the objectives of the solutions of the embodiments.

In addition, functional modules in the embodiments of the present invention may be integrated into one processing module, or each of the modules may exist alone physically, or two or more modules are integrated into one module. The integrated module may be implemented in a form of hardware, or may be implemented in a form of hardware in addition to a software functional module.

When the foregoing integrated module is implemented in a form of a software functional module, the integrated unit may be stored in a computer-readable storage medium. The software functional module is stored in a storage medium and includes instructions for instructing a computer device (which may be a personal computer, a server, or a network device) to perform some of the steps of the methods described in the embodiments of the present invention. The foregoing storage medium includes: any medium that can store program code, such as a removable hard disk, a read-only memory, a random access memory, a magnetic disk, or an optical disc.

Finally, it should be noted that the foregoing embodiments are merely intended for describing the technical solutions of the present invention, but not for limiting the present invention. Although the present invention is described in detail with reference to the foregoing embodiments, persons of ordinary skill in the art should understand that they may still make modifications to the technical solutions described in the foregoing embodiments or make equivalent replacements to some technical features thereof, without departing from the scope of the technical solutions of the embodiments of the present invention.

What is claimed is:

1. A method performed by a flash memory controller for accessing a flash memory array of a flash memory device, wherein the flash memory device comprises the flash memory controller and the flash memory array, comprising:

receiving a first write request having data to be written to a first address of the flash memory device;

obtaining an access history indicator of the first address, wherein the access history indicator of the first address indicates a type of a last access operation at the first address;

determining from the access history indicator of the first address that the last access operation at the first address is a write operation; and performing a fast-write operation to write the data of the first write request to the first address.

2. The method according to claim 1, further comprising:

receiving a second write request having data to be written to a second address of the flash memory device;

obtaining an access history indicator of the second address, wherein the access history indicator of the second address indicates a type of a last access operation at the second address;

determining from the access history indicator of the second address that the last access operation at the second address is a read operation; and performing a slow-write operation to write the data of the second write request to the second address.

3. The method according to claim 2, further comprising:

setting the access history indicator of the second address to indicate a write operation.

4. The method according to claim 1, further comprising:

determining that the data stored at the first address of the flash memory device has become invalid; and deleting the access history indicator of the first address.

5. The method according to claim 1, wherein before receiving the first write request, the method further comprises:

receiving a third write request having data to be written to the first address;

determining that the first address does not have a corresponding access history indicator yet;

writing the data of the third write request to the first address; and creating the access history indicator of the first address and setting the access history indicator of the first address to indicate a write operation.

6. The method according to claim 5, wherein the step of writing the data of the third write request to the first address comprises:

performing a slow-write operation at the first address.

7. A method performed by a flash memory controller for accessing a flash memory device, comprising:

receiving a first write request having data to be written to a first address;

determining that the first address does not have a corresponding access history indicator yet writing the data of the first write request to the first address;

creating the access history indicator of the first address and setting the access history indicator of the first address to indicate a write operation;

wherein the step of writing the data of the first write request to the first address comprises:

performing a slow-write operation at the first address;

receiving a first read request for reading data stored at the first address of the flash memory device;

performing a fast-read operation to obtain data at the first address;

determining that the first-read operation fails to correctly obtain the data at the first address;

performing a slow-read operation to obtain data at the first address in response to determining that the fast-read operation fails;

obtaining an access history indicator of the first address, wherein the access history indicator of the first address indicates a type of a last access operation at the first address;

determining from the access history indicator of the first address that the last access operation at the first address is a read operation; and perform a slow-write operation to write data obtained by the slow-read operation to the first address.

8. The method according to claim 7, further comprising:
determining that the data stored at the first address has become invalid; and
deleting the access history indicator of the first address.

9. A flash memory device comprising:
a flash memory array for storing data; and
a flash memory controller coupled to the flash memory array and configured to:
receive a first write request having data to be written to a first address of the flash memory array;
obtain an access history indicator of the first address, wherein the indicator of the first address indicates a type of a last access operation at the first address;
determine from the access history indicator of the first address that the last access operation at the first address is a write operation;
perform a fast-write operation to write the data of the first write request to the first address.

10. The flash memory device according to claim 9, wherein the flash memory controller is further configured to:
receive a second write request having data to be written to a second address of the flash memory array;
obtain an access history indicator of the second address, wherein the access history indicator of the second address indicates a type of a last access operation at the second address;
determine from the access history indicator of the second address that the last access operation at the second address is a read operation; and
perform a slow-write operation to write the data of the second write request to the second address.

11. The flash memory device according to claim 10, wherein the flash memory controller is further configured to:
set the access history indicator of the second address to indicate a write operation.

12. The flash memory device according to claim 9, wherein the flash memory controller is further configured to:
determine that the data stored at the first address has become invalid; and
delete the access history indicator of the first address.

13. The flash memory device according to claim 9, wherein before receiving the first write request, the flash memory controller is further configured to:
receive a third write request having data to be written to the first address;
determine that the first address does not have a corresponding access history indicator yet;
write the data of the third write request to the first address; and
create the access history indicator of the first address and set the access history indicator of the first address to indicate a write operation.

14. The flash memory device according to claim 13, wherein the flash memory controller is configured to write the data of the third write request by performing a slow-write operation at the first address.

15. The flash memory device according to claim 9, wherein the flash memory controller is further configured to:
receive a first read request for data stored at a third address of the flash memory array;
perform a fast-read operation to obtain the data at the third address;
determine that the fast-read operation fails to correctly obtain the data at the third address;
in response to determining that the first-read operation fails, perform a slow-read operation to obtain the data at the third address;
obtain an access history indicator of the third address, wherein the access history indicator of the third address indicates a type of a last access operation at the third address;
determine from the access history indicator of the third address that the last access operation at the third address is a read operation; and
write the data obtained by the slow-read operation to the third address.

16. The flash memory device according to claim 9, wherein the flash memory controller is further configured to:
receive a second read request for data stored at a fourth address of the flash memory array;
obtain an access history indicator of the fourth address, wherein the access history indicator of the fourth address indicates a type of a last access operation at the fourth address;
obtain a write speed mark of the fourth address, wherein the write speed mark indicates a type of write operation performed to store the data at the fourth address;
determine that the access history indicator of the fourth address indicates a read operation and the write speed mark of the fourth address indicates a fast-write operation;
perform a read operation to obtain the data at the fourth address; and
write the data obtained by the read operation at the fourth address to the fourth address.

17. The flash memory device according to claim 16, wherein the read operation at the fourth address is a slow-read operation.

18. The flash memory device according to claim 15, wherein the flash memory controller is configured to perform a slow-write operation to write the data obtained by the read operation to the fourth address; wherein the flash memory controller is further configured to set the write speed mark of the fourth address to indicate a slow-write operation.

* * * * *

UNITED STATES PATENT AND TRADEMARK OFFICE
CERTIFICATE OF CORRECTION

| | |
|---|---|
| PATENT NO. | : 10,732,898 B2 |
| APPLICATION NO. | : 16/105723 |
| DATED | : August 4, 2020 |
| INVENTOR(S) | : Shi et al. |

It is certified that error appears in the above-identified patent and that said Letters Patent is hereby corrected as shown below:

In the Claims

In Column 42, in Claim 7, Line 54, delete "yet" and insert -- yet; --, therefor.

In Column 42, in Claim 7, Lines 54-55, delete "writing the data of the first write request to the first address;" and insert the same at Line 55, as a new point.

Signed and Sealed this
Eleventh Day of October, 2022

Katherine Kelly Vidal
*Director of the United States Patent and Trademark Office*